United States Patent
Nakaki

(10) Patent No.: US 11,785,773 B2
(45) Date of Patent: Oct. 10, 2023

(54) SEMICONDUCTOR STORAGE DEVICE AND METHOD FOR MANUFACTURING THE SAME

(71) Applicant: Kioxia Corporation, Tokyo (JP)

(72) Inventor: Hiroshi Nakaki, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 261 days.

(21) Appl. No.: 17/190,717

(22) Filed: Mar. 3, 2021

(65) Prior Publication Data
US 2022/0085050 A1    Mar. 17, 2022

(30) Foreign Application Priority Data
Sep. 17, 2020    (JP) ................. 2020-156452

(51) Int. Cl.
| | |
|---|---|
| *H10B 43/20* | (2023.01) |
| *H01L 23/00* | (2006.01) |
| *H10B 41/10* | (2023.01) |
| *H10B 41/20* | (2023.01) |
| *H10B 41/35* | (2023.01) |
| *H10B 43/10* | (2023.01) |
| *H10B 43/35* | (2023.01) |
| *H10B 43/27* | (2023.01) |
| *H10B 41/27* | (2023.01) |
| *H10B 41/41* | (2023.01) |
| *H10B 41/30* | (2023.01) |

(52) U.S. Cl.
CPC ............ *H10B 43/20* (2023.02); *H01L 24/46* (2013.01); *H10B 41/10* (2023.02); *H10B 41/20* (2023.02); *H10B 41/27* (2023.02); *H10B 41/30* (2023.02); *H10B 41/35* (2023.02); *H10B 41/41* (2023.02); *H10B 43/10* (2023.02); *H10B 43/27* (2023.02); *H10B 43/35* (2023.02)

(58) Field of Classification Search
CPC ........ H10B 42/20; H10B 42/30; H10B 42/35; H10B 42/27; H10B 42/41; H10B 43/20; H10B 43/35; H10B 43/27
See application file for complete search history.

(56) References Cited

U.S. PATENT DOCUMENTS

| | | |
|---|---|---|
| 7,910,432 B2 | 3/2011 | Tanaka et al. |
| 9,991,272 B2 * | 6/2018 | Hamada ................. H10B 43/27 |

* cited by examiner

*Primary Examiner* — David A Zarneke
(74) *Attorney, Agent, or Firm* — Foley & Lardner LLP

(57) ABSTRACT

According to one embodiment, a semiconductor storage device includes: a plurality of first wiring layers stacked in a first direction; a first memory pillar including a first semiconductor layer extending in the first direction and penetrating the plurality of first wiring layers; a second wiring layer disposed above the first semiconductor layer; a second semiconductor layer including a first part disposed between the first semiconductor layer and the second wiring layer, a second part extending away from the first semiconductor layer, and a third part provided on the second part; a first insulating layer disposed between the first part and the second wiring layer and between the second part and the second wiring layer; and a second insulating layer provided on the first insulating layer and in contact with at least a portion of the second part.

11 Claims, 19 Drawing Sheets

A NAND flash memory is known as a semiconductor storage device.

SEMICONDUCTOR STORAGE DEVICE AND METHOD FOR MANUFACTURING THE SAME

CROSS-REFERENCE TO RELATED APPLICATIONS

This application is based upon and claims the benefit of priority from Japanese Patent Application No. 2020-156452, filed Sep. 17, 2020, the entire contents of which are incorporated herein by reference.

FIELD

Embodiments described herein relates generally to a semiconductor storage device and a method for manufacturing the same.

BACKGROUND

A NAND flash memory is known as a semiconductor storage device.

DETAILED DESCRIPTION

Figure 1:
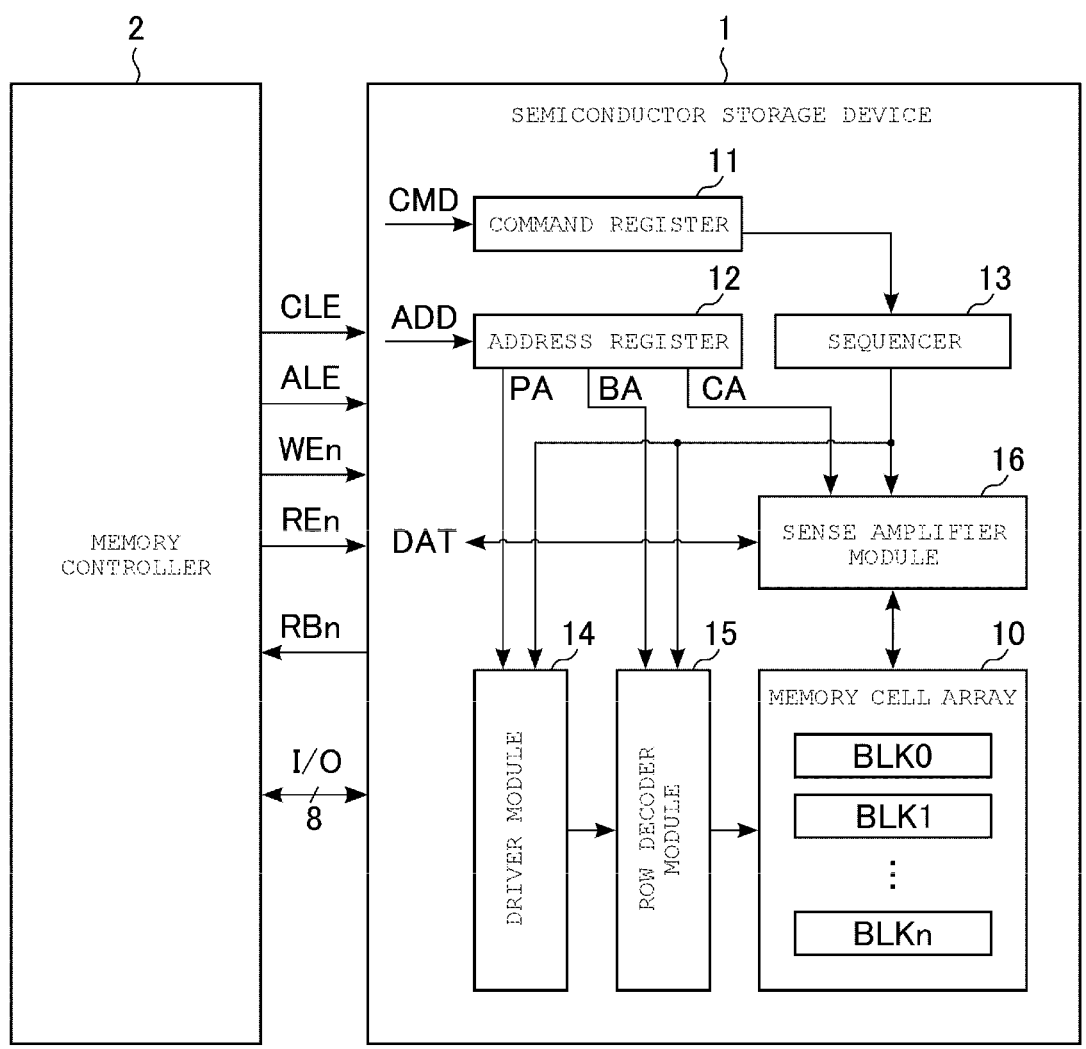
FIG. 1 is a block view showing a configuration example of a semiconductor storage device according to an embodiment.

Embodiments provide a semiconductor storage device that can improve reliability.

In general, according to one embodiment, a semiconductor storage device includes: a plurality of first wiring layers stacked in a first direction; a first memory pillar including a first semiconductor layer extending in the first direction and penetrating the plurality of first wiring layers; a second wiring layer disposed above the first semiconductor layer; a second semiconductor layer including a first part disposed between the first semiconductor layer and the second wiring layer, a second part extending away from the first semiconductor layer, and a third part provided on the second part; a first insulating layer disposed between the first part and the second wiring layer and between the second part and the second wiring layer; and a second insulating layer provided on the first insulating layer and in contact with at least a portion of the second part.

Hereinafter, embodiments will be described with reference to the drawings. In the following description, components having substantially the same functions and configurations are designated by the same reference numerals, and duplicate explanations will be given only when necessary. Further, each of the embodiments shown below exemplifies devices or methods for embodying the technical idea of this embodiment, and the technical idea of the embodiment does not specify the material, shape, structure, disposition, or the like of the components to the following. The technical idea of the embodiment may be modified in various ways within the scope of the claims.

A semiconductor storage device according to an embodiment will be described. Hereinafter, as a semiconductor storage device, a three-dimensional stack type NAND flash memory, in which memory cell transistors are stacked in a three-dimensional way on a semiconductor substrate, will be described as an example.

1. Configuration 1.1 Overall Configuration of Semiconductor Storage Device

First, the overall configuration of the semiconductor storage device will be described with reference to FIG. 1. FIG. 1 shows an example of a block view showing a basic overall configuration of a semiconductor storage device.

As shown in FIG. 1, the semiconductor storage device 1 is controlled by, for example, an external memory controller 2. The semiconductor storage device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of 1 or more). The block BLK is a set of a plurality of memory cells capable of storing data in a nonvolatile way and is used, for example, as a data erasing unit.

Further, the memory cell array 10 is provided with a plurality of bit lines and a plurality of word lines. Each memory cell is associated with, for example, one bit line and one word line. The detailed configuration of the memory cell array 10 will be described later.

The command register 11 stores a command CMD that the semiconductor storage device 1 receives from the memory controller 2. The command CMD includes, for example, instructions to cause the sequencer 13 to execute a read operation, a write operation, an erasing operation, and the like.

The address register 12 stores address information ADD that the semiconductor storage device 1 receives from the memory controller 2. The address information ADD includes, for example, a block address BA, a page address PA, and a column address CA. For example, the block address BA, the page address PA, and the column address CA are used to select the block BLK, the word line, and the bit line, respectively.

The sequencer 13 controls the overall operation of the semiconductor storage device 1. For example, the sequencer 13 executes the read operation, the write operation, the erasing operation, and the like by controlling the driver module 14, the row decoder module 15, the sense amplifier module 16, and the like based on the command CMD stored in the command register 11.

The driver module 14 generates a voltage which is used in the read operation, the write operation, the erasing operation, and the like. Thereafter, the driver module 14 applies the generated voltage to a signal line corresponding to the selected word line based on, for example, the page address PA stored in the address register 12.

The row decoder module 15 selects one block BLK in the corresponding memory cell array 10 based on the block address BA stored in the address register 12. Thereafter, the row decoder module 15 transfers, for example, the voltage applied to the signal line corresponding to the selected word line to the selected word line in the selected block BLK.

In the write operation, the sense amplifier module 16 applies a voltage to each bit line according to the write data DAT received from the memory controller 2. Further, in the read operation, the sense amplifier module 16 determines the data stored in the memory cell based on the voltage of the bit line and transfers the determination result to the memory controller 2 as the read data DAT.

The communication between the semiconductor storage device 1 and the memory controller 2 supports, for example, the NAND interface standard. For example, in the communication between the semiconductor storage device 1 and the memory controller 2, a command latch enable signal CLE, an address latch enable signal ALE, a write enable signal WEn, a read enable signal REn, a ready busy signal RBn, and an input/output signal I/O are used.

The input/output signal I/O is, for example, a signal having an 8 bit length, and may include the command CMD, the address information ADD, data DAT, and the like.

The command latch enable signal CLE is a signal indicating that the input/output signal I/O received by the semiconductor storage device 1 is the command CMD.

The address latch enable signal ALE is a signal indicating that the signal I/O received by the semiconductor storage device 1 is the address information ADD.

The write enable signal WEn is a signal for instructing the semiconductor storage device 1 to input the input/output signal I/O.

The read enable signal REn is a signal for instructing the semiconductor storage device 1 to output the input/output signal I/O.

The ready busy signal RBn is a signal for notifying the memory controller 2 of whether the semiconductor storage device 1 is in a ready state for receiving an instruction or in a busy state for not receiving an instruction from the memory controller 2.

The semiconductor storage device 1 and the memory controller 2 described above may constitute one semiconductor device by a combination thereof. Examples of such a semiconductor device include a memory card such as an SD™ card, a solid state drive (SSD), and the like.

1.2 Memory Cell Array Circuit Configuration

Next, an example of the circuit configuration of the memory cell array 10 will be described with reference to FIG. 2. In the example in FIG. 2, one block BLK out of the plurality of blocks BLK in the memory cell array 10 is extracted and shown.

Figure 2:
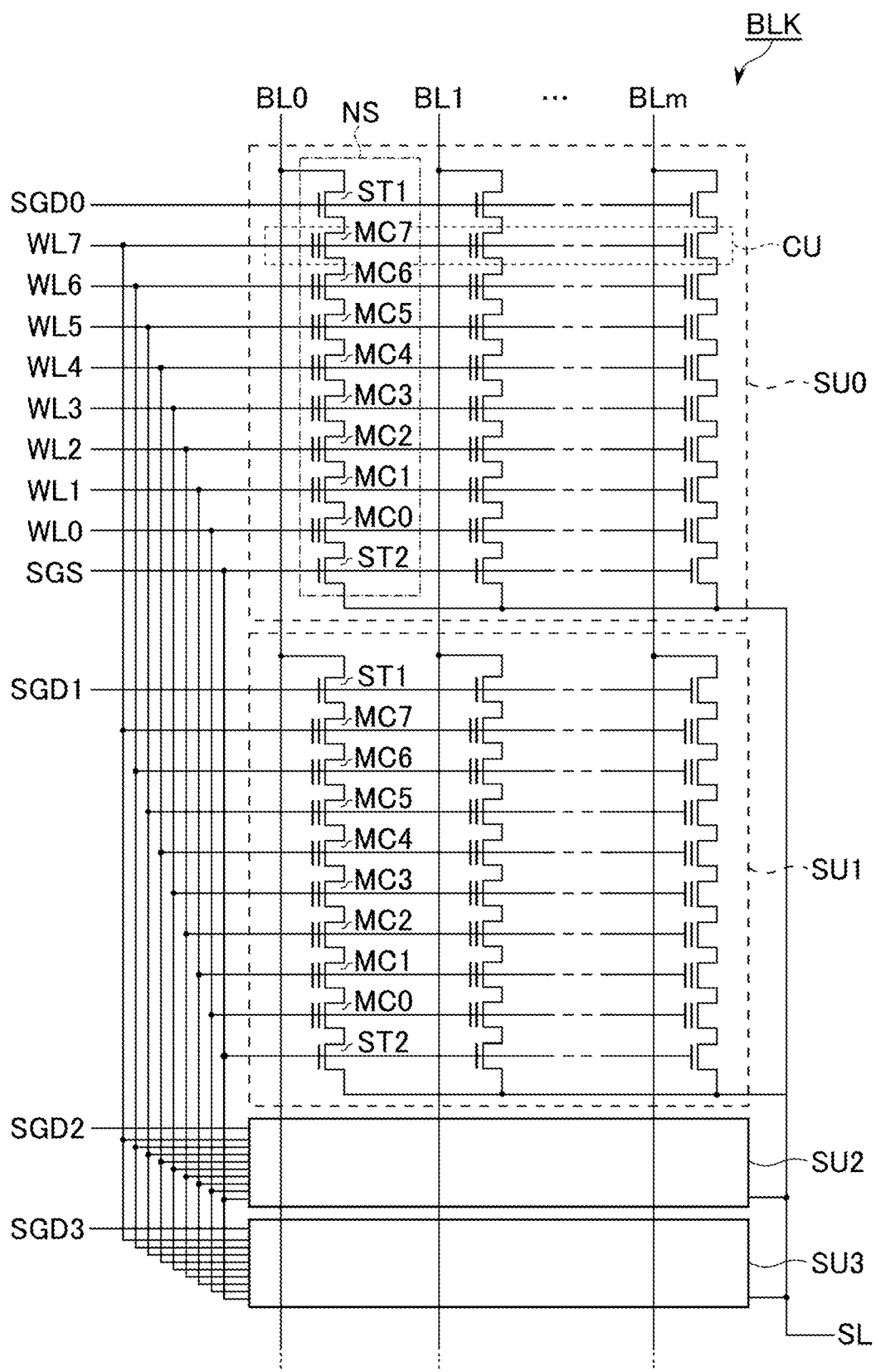
FIG. 2 is a circuit view of a memory cell array in the semiconductor storage device according to the embodiment.

As shown in FIG. 2, the block BLK includes, for example, four string units SU0 to SU3. Each string unit SU includes a plurality of NAND strings NS.

The plurality of NAND strings NS are each associated with the bit lines BL0 to BLm (m is an integer of 1 or more). Each NAND string NS includes, for example, memory cell transistors MC0 to MC7 and select transistors ST1 and ST2.

The memory cell transistor MC includes a control gate and a charge storage layer, and stores the data in a nonvolatile way. Each of the select transistors ST1 and ST2 is used for selecting the string unit SU during the various operations.

The memory cell transistor MC may be a MONOS type in which an insulating layer is used for the charge storage layer, or may be an FG type in which a conductive layer is used for the charge storage layer. Hereinafter, in the present embodiment, the MONOS type will be described as an example.

In each NAND string NS, a drain of the select transistor ST1 is connected to the associated bit line BL and a source of the select transistor ST1 is connected to one end of the memory cell transistors MC0 to MC7 which are connected in series. In the same block BLK, gates of the select transistors ST1 in the string units SU0 to SU3 are commonly connected to the select gate lines SGD0 to SGD3, respectively. The select gate lines SGD0 to SGD3 are connected to the row decoder module 15.

In each NAND string NS, a drain of the select transistor ST2 is connected to the other end of the memory cell transistors MC0 to MC7 which are connected in series. In the same block BLK, a source of the select transistor ST2 is commonly connected to a source line SL, and a gate of the select transistor ST2 is commonly connected to a select gate line SGS. The select gate line SGS is connected to the row decoder module 15.

The bit line BL commonly connects one NAND string NS in each of the string units SU0 to SU3 in each block BLK. The source line SL is commonly connected, for example, among the plurality of blocks BLK.

A set of the plurality of memory cell transistors MC connected to a common word line WL in one string unit SU is referred to as, for example, a cell unit CU. For example, a storage capacitance of the cell unit CU that includes the memory cell transistors MC, each of which stores 1 bit data, is defined as "one page data". The cell unit CU may have a storage capacitance of data with two pages or more depending on the number of bits of data stored in the memory cell transistors MC.

The circuit configuration of the memory cell array 10 in the semiconductor storage device 1 according to the present embodiment is not limited to the configuration described above. For example, the number of memory cell transistors MC and the select transistors ST1 and ST2 in each NAND string NS may be designed to any number. The number of string units SU in each block BLK may be designed to any number.

1.3 Plan Configuration of Memory Cell Array

Figure 3:
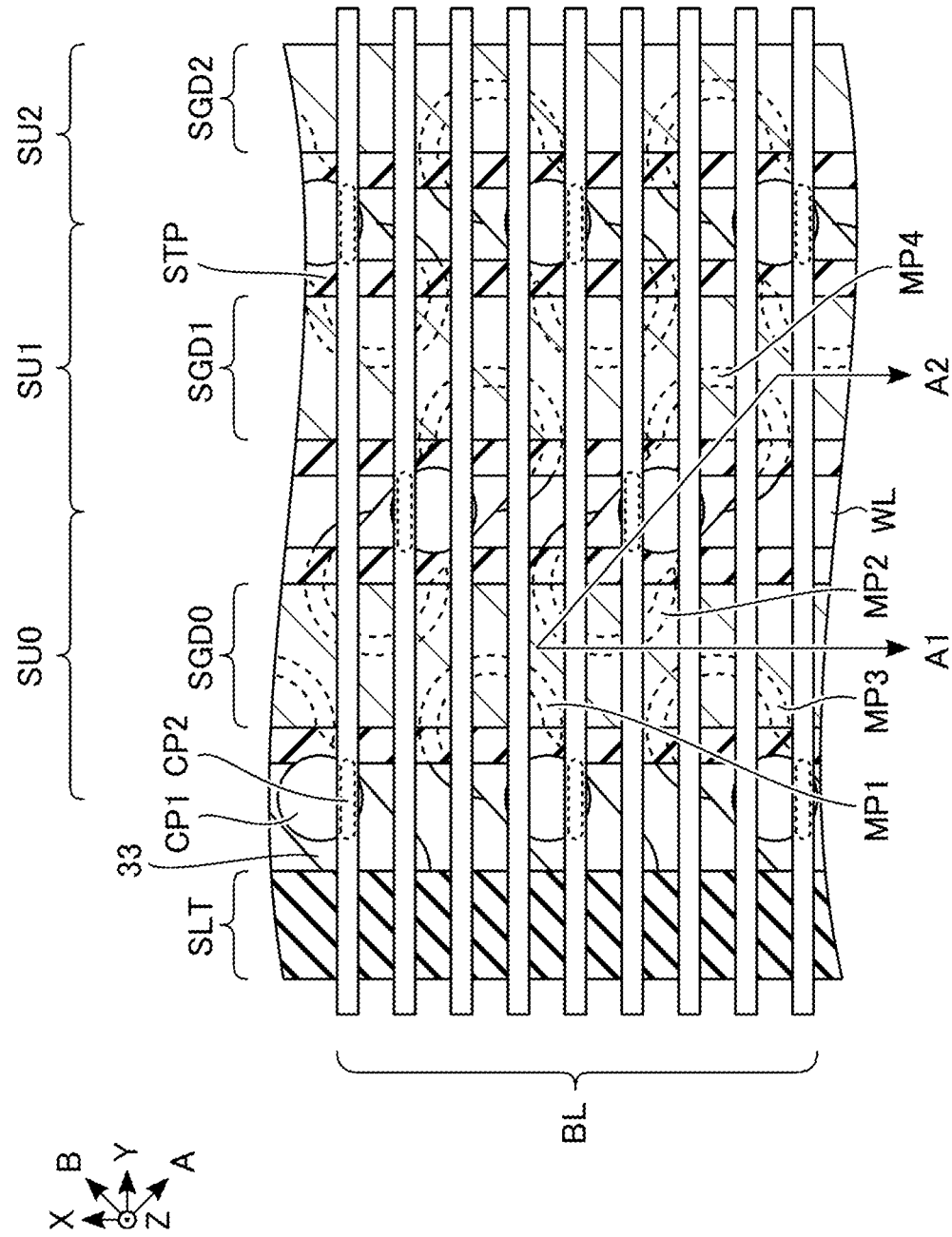
FIG. 3 is a plan view of the memory cell array in the semiconductor storage device according to the embodiment.

Next, an example of a plan configuration of the memory cell array 10 will be described with reference to FIG. 3. FIG. 3 shows a plan view of a part of a region of the memory cell array 10, and a part of the insulating layer is omitted for simplification of the description.

In the following description, the X direction is substantially parallel to the semiconductor substrate and corresponds to the extending direction of the word line WL. The Y direction is substantially parallel to the semiconductor substrate and orthogonal to the X direction and corresponds to the extending direction of the bit line BL. The Z direction is substantially perpendicular to the semiconductor substrate and corresponds to a direction intersecting the X direction and the Y direction. Further, for example, in the XY plane which is substantially parallel to the semiconductor substrate, a direction connecting the center of a memory pillar MP2 and the center of a memory pillar MP4, which will be described later, is referred to as "A" direction. A direction that is substantially parallel to the semiconductor substrate and orthogonal to the A direction is referred to as "B" direction. That is, the A direction is substantially parallel to the semiconductor substrate and corresponds to a direction different from the X direction and the Y direction. The B direction corresponds to a direction that is substantially parallel to the semiconductor substrate and orthogonal to the A direction.

As shown in FIG. 3, a slit SLT extending in the X direction is provided on a side surface of the word line WL extending in the X direction facing the Y direction. In the present embodiment, the select gate line SGS and the word lines WL0 to WL7 are sequentially stacked above the semiconductor substrate. The slit SLT separates the select gate line SGS and the word line WL for each block BLK, for example.

For example, the string units SU0 to SU3 are arranged side by side in the Y direction, and a plurality of memory pillars MP are provided for each string unit SU.

The memory pillar MP corresponds to the NAND string NS. More specifically, the memory pillar MP corresponds to the memory cell transistors MC0 to MC7 and the select transistor ST2 in the NAND string NS. The memory pillar MP penetrates (passes through) the select gate line SGS and the word lines WL0 to WL7 and extends in the Z direction. The details of the structure of the memory pillar MP will be described later.

For example, the plurality of memory pillars MP in each string unit SU are arranged so as to have two columns of staggered arrangement in the X direction. More specifically, for example, in the string unit SU0, the memory pillar MP1 and the memory pillar MP3 are disposed adjacent to each other in the X direction. Further, the memory pillar MP2 is disposed between the memory pillar MP1 and the memory pillar MP3 in the X direction and disposed at a location different from the memory pillars MP1 and MP3 in the Y direction. In other words, the memory pillar MP2 is disposed adjacent to the memory pillar MP1 in the A direction and disposed adjacent to the memory pillar MP2 in the B direction.

The arrangement of memory pillars MP may be configured in any arrangement. For example, the arrangement of memory pillars MP may be four columns of staggered arrangements. Further, the arrangement of the memory pillars MP does not have to be a staggered arrangement.

The select transistor ST1 is provided on each memory pillar MP. In the string unit SU, the gates of the plurality of select transistors ST1 provided on each of the plurality of memory pillars MP are commonly connected to the select gate line SGD. More specifically, for example, in the string unit SU0, the select transistor ST1 provided in each of the memory pillars MP1 to MP3 is connected to the select gate line SGD0. The select gate line SGD0 is provided between the select transistor ST1 provided on the memory pillar MP1 (and MP3) and the select transistor ST1 provided on the memory pillar MP2 in the Y direction, and extends in the X direction. For example, the central location of the select gate line SGD0 in the Y direction is located between the central location of the memory pillar MP1 (and MP3) and the central location of the memory pillar MP2.

A stopper layer STP extending in the X direction is provided on an upper portion of the side surface of each select gate line SGD facing the Y direction. The stopper layer STP functions as an etching stopper when a contact plug CP1, which will be described later, is processed.

In the present embodiment, in the two string units SU adjacent to each other, the select transistors ST1 of the two memory pillars MP which are adjacent to each other in the A direction or the B direction are commonly connected to one bit line BL via the contact plugs CP1 and CP2. In other words, the two select transistors ST1 that are provided between the two select gate lines SGD and adjacent to each other in the A direction or the B direction are commonly connected to one contact plug CP1.

More specifically, for example, a semiconductor layer 33 of the memory pillar MP2 of the string unit SU0 and a semiconductor layer 33 of the memory pillar MP4 of the string unit SU1, which are adjacent to each other in the A direction, are connected to one contact plug CP1.

A contact plug CP2 is provided on the contact plug CP1. The contact plug CP2 connects one of the plurality of bit lines BL extending in the Y direction to the contact plug CP1. That is, the plurality of memory pillars MP in the string unit SU are each connected to the bit lines BL, which are different from each other, via the select transistor ST1 and the contact plugs CP1 and CP2. More specifically, for example, the memory pillars MP1 to MP3 are each connected to the bit lines BL different from each other. One memory pillar MP of each string unit SU is commonly connected to one bit line BL.

1.4 Cross-Sectional Configuration of Memory Cell Array

Figure 4:
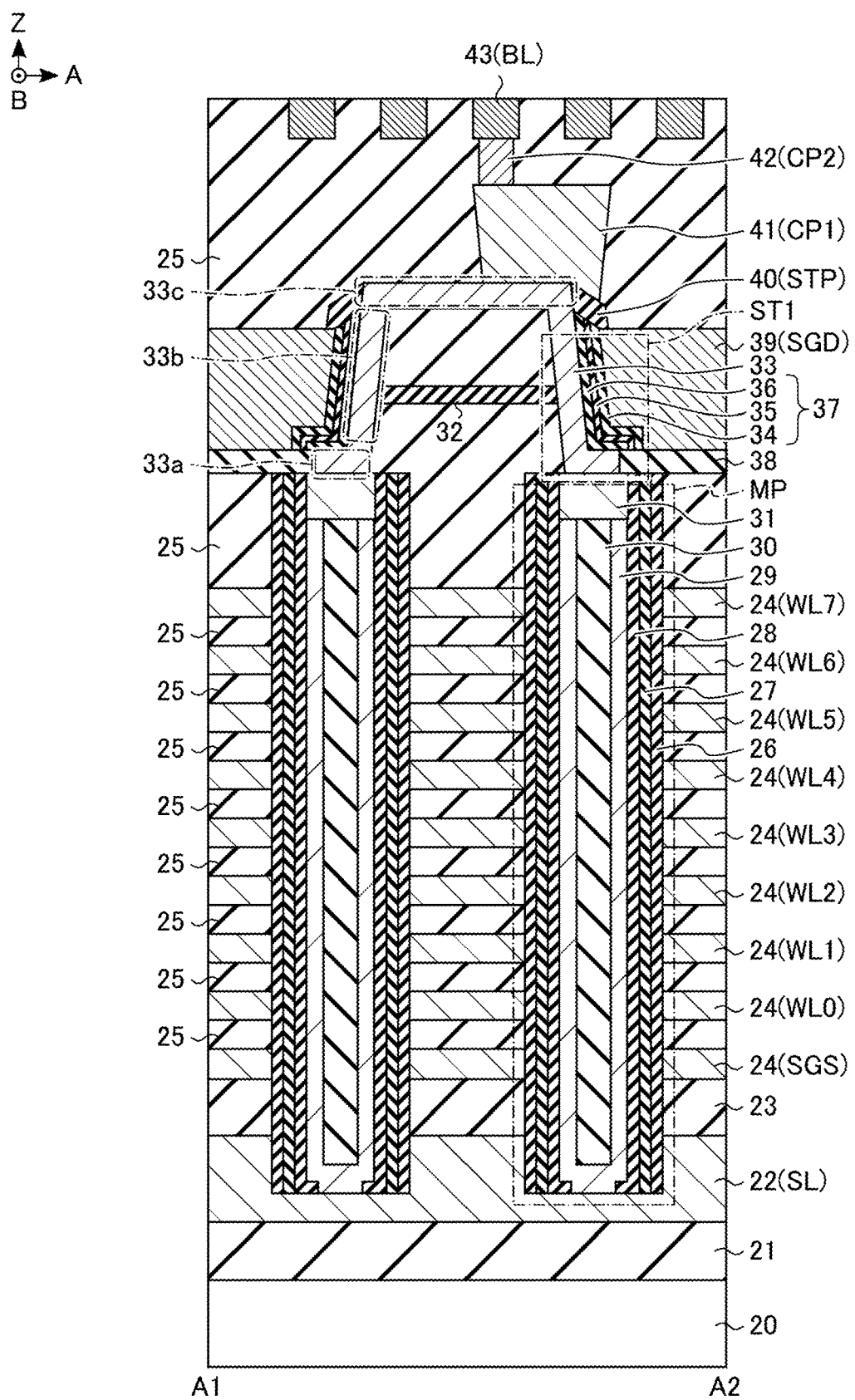
FIG. 4 is a cross-sectional view of the memory cell array in the semiconductor storage device according to the embodiment.

Next, an example of a cross-sectional configuration of the memory cell array 10 will be described with reference to FIG. 4. FIG. 4 is a cross-sectional view taken along the line A1-A2 in FIG. 3.

As shown in FIG. 4, an insulating layer 21 is provided on the semiconductor substrate 20. A silicon oxide ($SiO_2$) is used for the insulating layer 21, for example. A circuit such as the row decoder module 15 or the sense amplifier module 16 may be provided in a region where the insulating layer 21 is provided, that is, between the semiconductor substrate 20 and a wiring layer 22.

The wiring layer 22 that extends in the X direction and functions as a source line SL is provided on the insulating layer 21. The wiring layer 22 is made of a conductive material, and for example, an n-type semiconductor, a p-type semiconductor, or a metal material is used.

An insulating layer 23 is provided on the wiring layer 22. SiO₂ is used for the insulating layer 23, for example.

On the insulating layer 23, nine layers of wiring layers 24 that function as the select gate lines SGS and the word lines WL0 to WL7 from the lower layer, and nine layers of insulating layers 25 are alternately stacked. The wiring layer 24 is made of a conductive material, and for example, an n-type semiconductor, a p-type semiconductor, or a metal material is used. Hereinafter, a case where a stacked structure of titanium. nitride (TiN) and tungsten (W) is used as the wiring layer 24 will be described. TiN has a function as a barrier layer for preventing the reaction between W and $SiO_2$ or as an adhesion layer for improving the adhesion of W when W is formed by chemical vapor deposition (CVD). Further, $SiO_2$ is used for the insulating layer 25, for example.

The memory pillar MP is provided such that the memory pillar MP penetrates the nine layers of wiring layers 24 and the bottom surface thereof reaches the wiring layer 22. The memory pillar MP includes a block insulating film 26, a charge storage layer 27, a tunnel insulating film 28, a semiconductor layer 29, a core layer 30, and a cap layer 31.

More specifically, a hole corresponding to the memory pillar MP is provided such that the hole penetrates a plurality of wiring layers 24 and a plurality of insulating layers 25 and the bottom surface thereof reaches the wiring layer 22. The block insulating film 26, the charge storage layer 27, and the tunnel insulating film 28 are sequentially stacked on a side surface of the hole. The semiconductor layer 29 is provided such that a side surface thereof is in contact with the tunnel insulating film 28 and a bottom surface thereof is in contact with the wiring layer 22. The semiconductor layer 29 is a region where channels of the select transistor ST2 and the memory cell transistor MC are formed. Therefore, the semiconductor layer 29 functions as a signal line that connects current paths of the select transistor ST2 and the memory cell transistors MC0 to MC7. The core layer 30 is provided in the semiconductor layer 29. The cap layer 31 in which a side surface thereof is in contact with the tunnel insulating film 28 is provided on the semiconductor layer 29 and the core layer 30. That is, the memory pillar MP includes the semiconductor layer 29 that passes through the inside of the plurality of wiring layers 24 and extends in the Z direction. The cap layer 31 may be abolished.

$SiO_2$ is used for the block insulating film 26, the tunnel insulating film 28, and the core layer 30, for example. A silicon nitride (SiN) is used for the charge storage layer 27, for example. Polysilicon is used for the semiconductor layer 29 and the cap layer 31, for example.

The memory cell transistors MC0 to MC7 are respectively configured by the memory pillar MP and eight layers of wiring layers 24 that respectively function as word lines WL0 to WL7. Similarly, the select transistor ST2 is configured by the memory pillar MP and the wiring layer 24 that functions as the select gate line SGS.

Above the memory pillar MP, an insulating layer 32 extending in the X direction and the Y direction is provided between the layers of the insulating layer 25. The insulating layer 32 functions as an etching stopper when a trench (that is, a groove pattern) corresponding to the wiring layer 39 is processed. The insulating layer 32 may be omitted. An insulating material capable of obtaining an etching selection ratio with respect to the insulating layer 25 is used for the insulating layer 32. Hereinafter, a case where SiN is used as the insulating layer 32 will be described.

A trench is provided such that the trench penetrates the insulating layers 25 and 32, a bottom surface thereof reaches the memory pillar MP, and the trench extends in the X direction.

A wiring layer 39 extending in the X direction is provided in the trench. The wiring layer 39 functions as a select gate line SGD. The height location of an upper surface of the wiring layer 39 in the Z direction is lower than that of upper surfaces of the semiconductor layer 33 and the insulating layer 40, which will be described later. For example, the wiring layer 39 is made of a conductive material, and for example, an n-type semiconductor, a p-type semiconductor, or a metal material is used. Hereinafter, a case where a TiN/W stacked structure is used as the wiring layer 39 will be described.

On the side surface and the bottom surface of the trench above the memory pillar MP, a semiconductor layer 33 and insulating layers 34 to 36 are provided between the memory pillar MP and the wiring layer 39. The semiconductor layer 33 is a region in which the channel of the select transistor ST1 is formed. The insulating layers 34 to 36 function as a gate insulating film of the select transistor ST1. The height location of the upper surface of the insulating layers 34 to 36 is lower than that of the upper surface of the semiconductor layer 33. In the present embodiment, the case where three layers of insulating layers 34 to 36 are used as the gate insulating film will be described, but the gate insulating film may be one or more layers. For example, for the gate insulating film, a MONOS structure (more specifically, a stacked structure of an insulating layer, a charge storage layer, and an insulating layer) capable of controlling a threshold voltage may be used. In the present embodiment, for example, $SiO_2$ is used for the insulating layers 34 and 36, and SiN is used for the insulating layer 35. Hereinafter, the stacked structure of the insulating layers 34 to 36 is also simply referred to as a stacked body 37.

The semiconductor layer 33 has a shape (hereinafter referred to as a crank shape) bent in the substantially Z direction and the Y direction along the wiring layer 39. More specifically, the semiconductor layer 33 includes two semiconductor layers 33a, two semiconductor layers 33b, and a semiconductor layer 33c. The two semiconductor layers 33a are provided on the respective cap layers 31 of the memory pillars MP that are located adjacent to each other in the A direction (or the B direction). The bottom surfaces of the two semiconductor layers 33b are in contact with the corresponding semiconductor layers 33a, respectively. The two semiconductor layers 33b are disposed along the side surface of the wiring layer 39 facing the Y direction. The semiconductor layer 33c is in contact with upper surface of two semiconductor layers 33b, each of which is provided on the memory pillars MP adjacent to each other in the A direction (or the B direction). With this structure, two select transistors ST1 adjacent to each other in the A direction (or B direction) are connected by one semiconductor layer 33. The height location of the bottom surface of the semiconductor layer 33c in the Z direction is higher than the height location of an upper surface of the wiring layer 39. The semiconductor layer 33 has a crank shape in which the semiconductor layer 33a extending in the Y direction, the semiconductor layer 33b extending in the substantially Z direction, and the semiconductor layer 33c extending in the Y direction are sequentially connected. Polysilicon or amorphous silicon is used for the semiconductor layer 33, for example. In order to connect the conductor 41 and the channel region of the select transistor ST1 with low resistance, an n-type semiconductor or a p-type semiconductor into which impurities have been introduced may be used for the semiconductor layer 33c.

An insulating layer 38 is provided on the side surface and the bottom surface of the trench excluding the region where the semiconductor layer 33 and the stacked body 37 are provided. $SiO_2$ is used for the insulating layer 38, for example.

An insulating layer 40 is in contact with the side surface of the upper portion of the semiconductor layer 33 and to cover an upper surface of the stacked body 37 and the upper surface of the end portion of the wiring layer 39 in the Y direction. A part of the bottom surface of the insulating layer 40 may be in contact with the upper surface (of the end portion) of the wiring layer 39. That is, the height location of the bottom surface of the insulating layer 40 may be the same as the height location of the upper surface of the wiring layer 39. The insulating layer 40 functions as a stopper layer STP. More specifically, the insulating layer 40 functions as a surface protective layer of the stacked body 37 when the contact plug CP1 is processed. Further, by providing the insulating layer 40 between the contact plug CP1 and the wiring layer 39, the insulating layer 40 prevents a short circuit between the wirings or dielectric breakdown between the contact plug CP1 and the wiring layer 39. Therefore, the width of the insulating layer 40 in the Y direction may be sufficiently wide so that even when the contact plug CP1 has a locational displacement, the short circuit between the wirings or the dielectric breakdown between the contact plug CP1 and the wiring layer 39 does not occur. SiN is used for the insulating layer 40, for example. When the contact plug CP1 is processed, an insulating material capable of obtaining a sufficient etching selection ratio with respect to the insulating layer 25 may be used for the insulating layer 40.

The select transistor ST1 includes the semiconductor layer 33, the stacked body 37, and the wiring layer 39. The channel region of the select transistor ST1 is formed along the crank shape by the crank-shaped semiconductor layers 33 (semiconductor layer 33a and semiconductor layer 33b) provided along the side surface and the bottom surface of the wiring layer 39.

The conductor 41 that functions as a contact plug CP1 is provided on the semiconductor layer 33 (semiconductor layer 33c). The example of FIG. 4 shows a case where a part of the conductor 41 is provided on the insulating layer 40 by the locational displacement due to the manufacturing variation, but the conductor 41 may not be provided on the insulating layer 40. In other words, the bottom surface of the conductor 41 does not have to be in contact with the insulating layer 40.

A conductor 42 that functions as a contact plug CP2 is provided on the conductor 41.

A wiring layer 43 that functions as the bit line BL and extends in the Y direction is provided on the conductor 42.

The conductors 41 and 42 and the wiring layer 43 are made of a conductive material, and for example, a metal material is used.

2. Disposition of Select Transistor ST1 and Select Gate Line SGD

Figure 5:
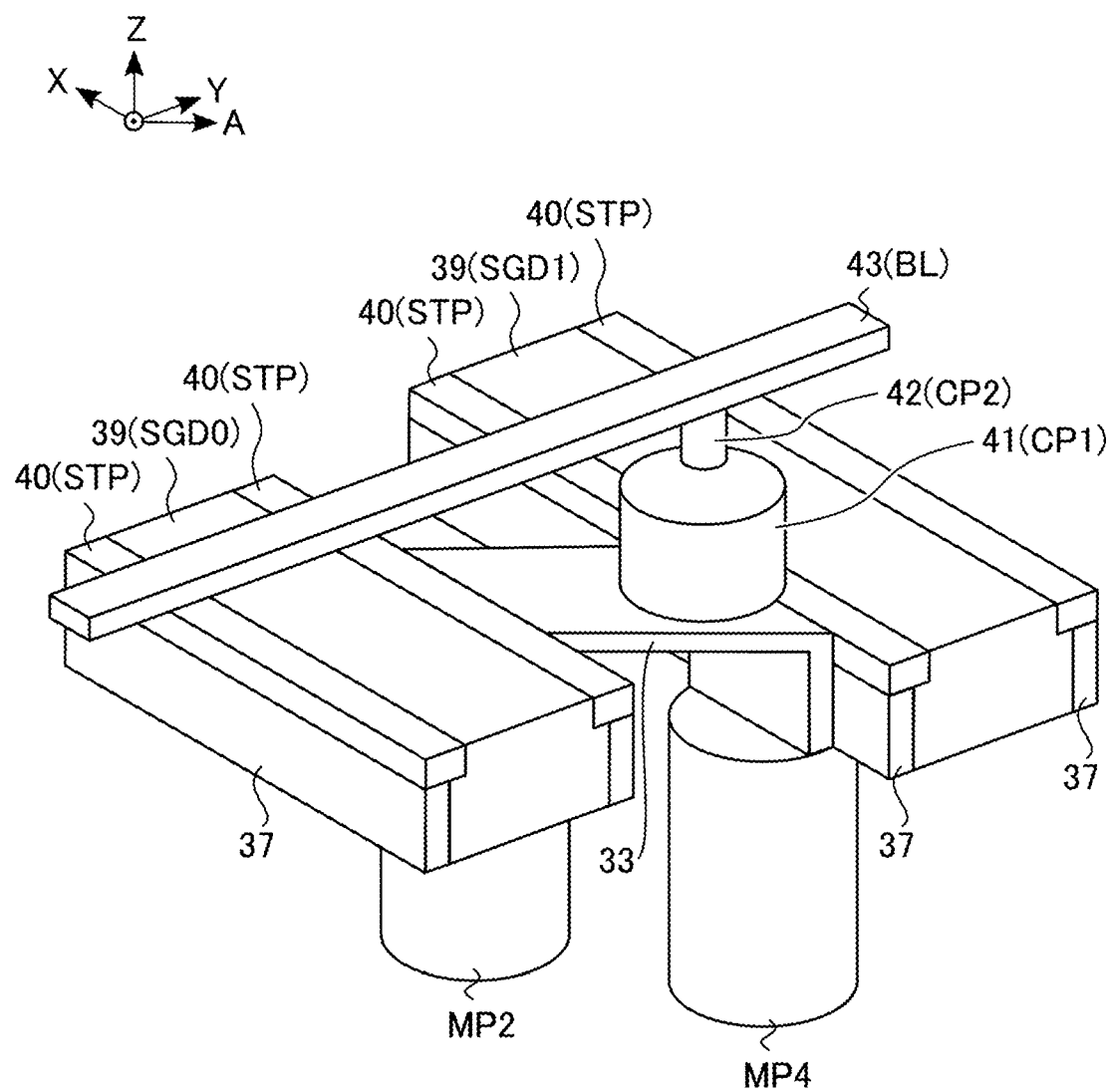
FIG. 5 is a perspective view of a select transistor ST1 in the memory cell array in the semiconductor storage device according to the embodiment.

Next, an example of the disposition of the select transistor ST1 and the select gate line SGD will be described with reference to FIG. 5. FIG. 5 is a perspective view showing the disposition of the upper portion of the memory pillar MP, the select transistor ST1, the select gate line SGD, the contact plugs CP1 and CP2, and the bit line BL. In the example of FIG. 5, for the sake of brevity, the memory pillars MP2 and MP4 described in FIG. 3 are shown, and the other memory pillars MP are omitted. Further, in the example in FIG. 5, a part of the insulating layer is omitted.

As shown in FIG. 5, for example, two memory pillars MP2 and MP4 are arranged in a staggered arrangement in the X direction. A wiring layer 39 (select gate line SGD0) extending in the X direction passes above apart of a region of the memory pillar MP2. Similarly, the wiring layer 39 (select gate line SGD1) extending in the X direction passes above a part of a region of the memory pillar MP4. The semiconductor layer 33 is provided between the above part of the memory pillar MP2 and the above part of the memory pillar MP4. The semiconductor layer 33 is connected to the wiring layer 43 via the conductors 41 and 42. The example of FIG. 5 shows a case where a part of the conductor 41 (contact plug CP1) is provided on the insulating layer 40, which is provided on the side surface of the wiring layer 39, by the locational displacement due to the manufacturing variation, but the conductor 41 may not be provided on the insulating layer 40.

3. Method for Manufacturing Memory Cell Array

Next, an example of a method for manufacturing the memory cell array 10 will be described with reference to FIGS. 6 to 18. Each of FIGS. 6 to 18 shows a plan and a cross-section (A1-A2 cross-section) along the A1-A2 line of the memory cell array 10 in the manufacturing process.

Hereinafter, as a method for forming the wiring layer 24, a case will be described in which a method (hereinafter, referred to as "replacement") is used where the structure corresponding to the wiring layer 24 is formed of the sacrifice layer and then the sacrifice layer 44 is removed and replaced with a conductive material (wiring layer 24).

Figure 6:
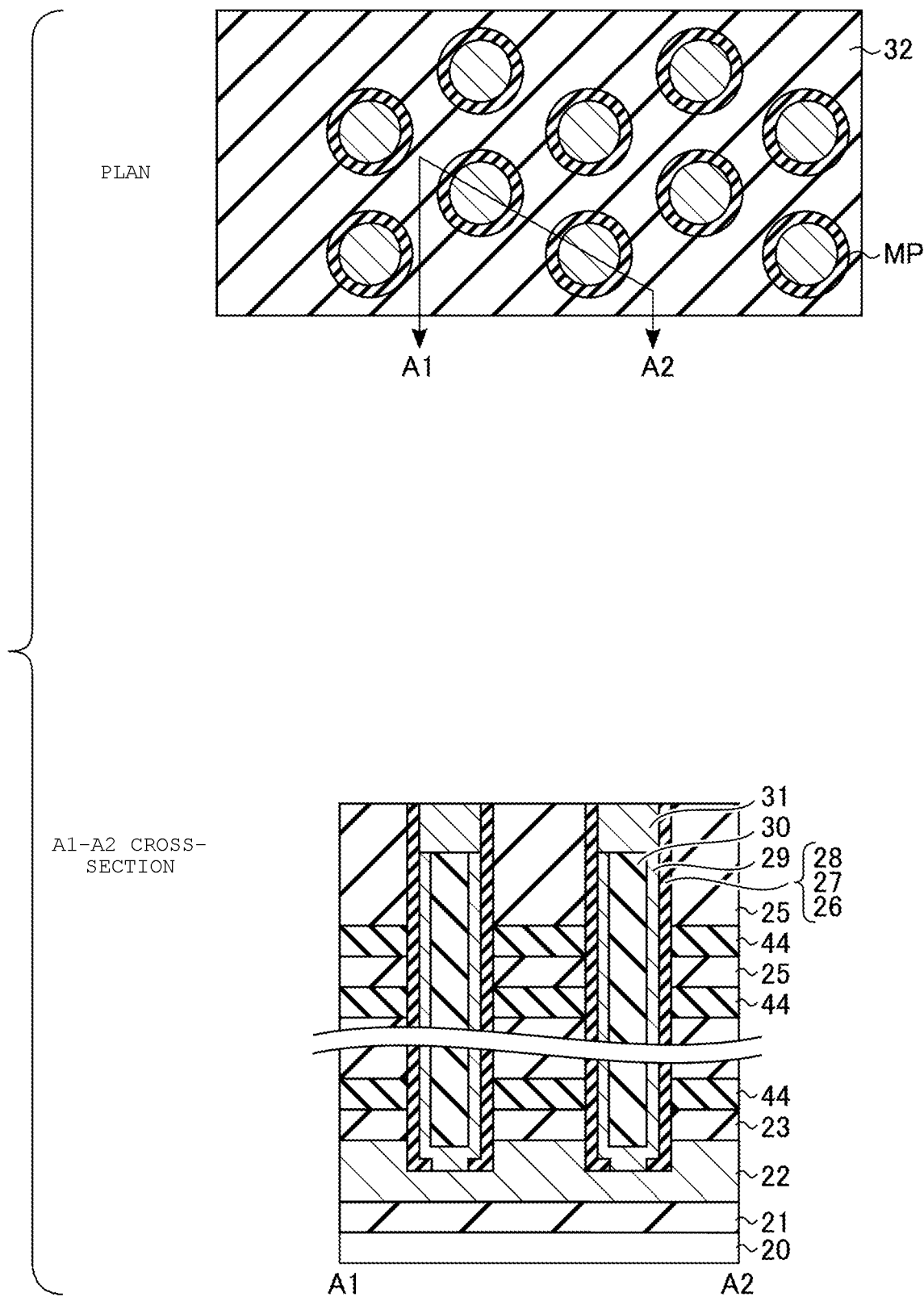
FIG. 6 is a cross-sectional view of the memory array showing an example of a manufacturing process of the semiconductor storage device according to the embodiment.

As shown in FIG. 6, the insulating layer 21, the wiring layer 22, and the insulating layer 23 are sequentially formed on the semiconductor substrate 20. Next, nine layers of sacrifice layers 44 corresponding to the wiring layer 24 and the nine layers of insulating layers 25 are alternately stacked. A material capable of obtaining a wet etching selection ratio with respect to the insulating layer 25 is used for the sacrifice layer 44. The case where SiN is used for the sacrifice layer 44 will be described below.

Next, the memory pillar MP extending in the Z direction is formed. More specifically, first, a hole is formed such that the hole penetrates the nine layers of insulating layers 25, the nine layers of sacrifice layers 44, and the insulating layer 23, and the bottom surface thereof reaches the wiring layer 22. Next, the block insulating film 26, the charge storage layer 27, and the tunnel insulating film 28 are sequentially stacked, and then the block insulating film 26, the charge storage layer 27, and the tunnel insulating film 28 which are on the uppermost insulating layer 25 and the bottom surface of the hole are removed, and the wiring layer 22 is exposed on the bottom surface of the hole. Next, the semiconductor layer 29 and the core layer 30 are formed, and the inside of the hole is embedded. Next, the semiconductor layer 29 and the core layer 30 on the uppermost insulating layer 25 are removed. At this time, the semiconductor layer 29 and the core layer 30 at the upper portion of the hole are also removed. Next, the cap layer 31 is formed so as to embed the upper portion of the hole.

Figure 7:
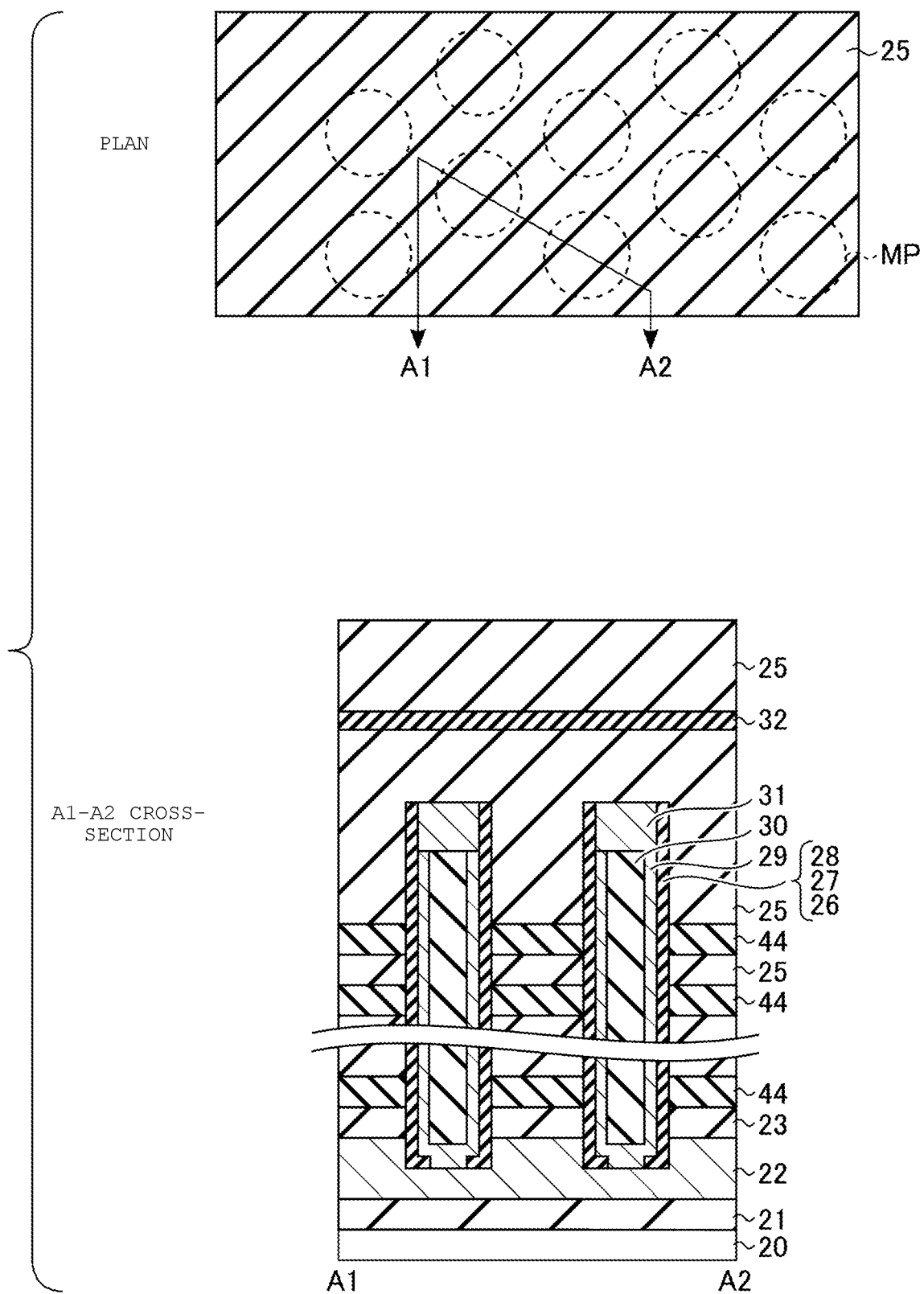
FIG. 7 is a cross-sectional view of the memory array showing an example of a manufacturing process of the semiconductor storage device according to the embodiment.

As shown in FIG. 7, the insulating layer 25 is formed on the memory pillar MP and then the insulating layer 32 is formed so as to cover an upper surface of the memory pillar MP. At this time, the insulating layer 32 in the region where the slit SLT is formed later is removed.

Next, the insulating layer 25 is formed.

Figure 8:
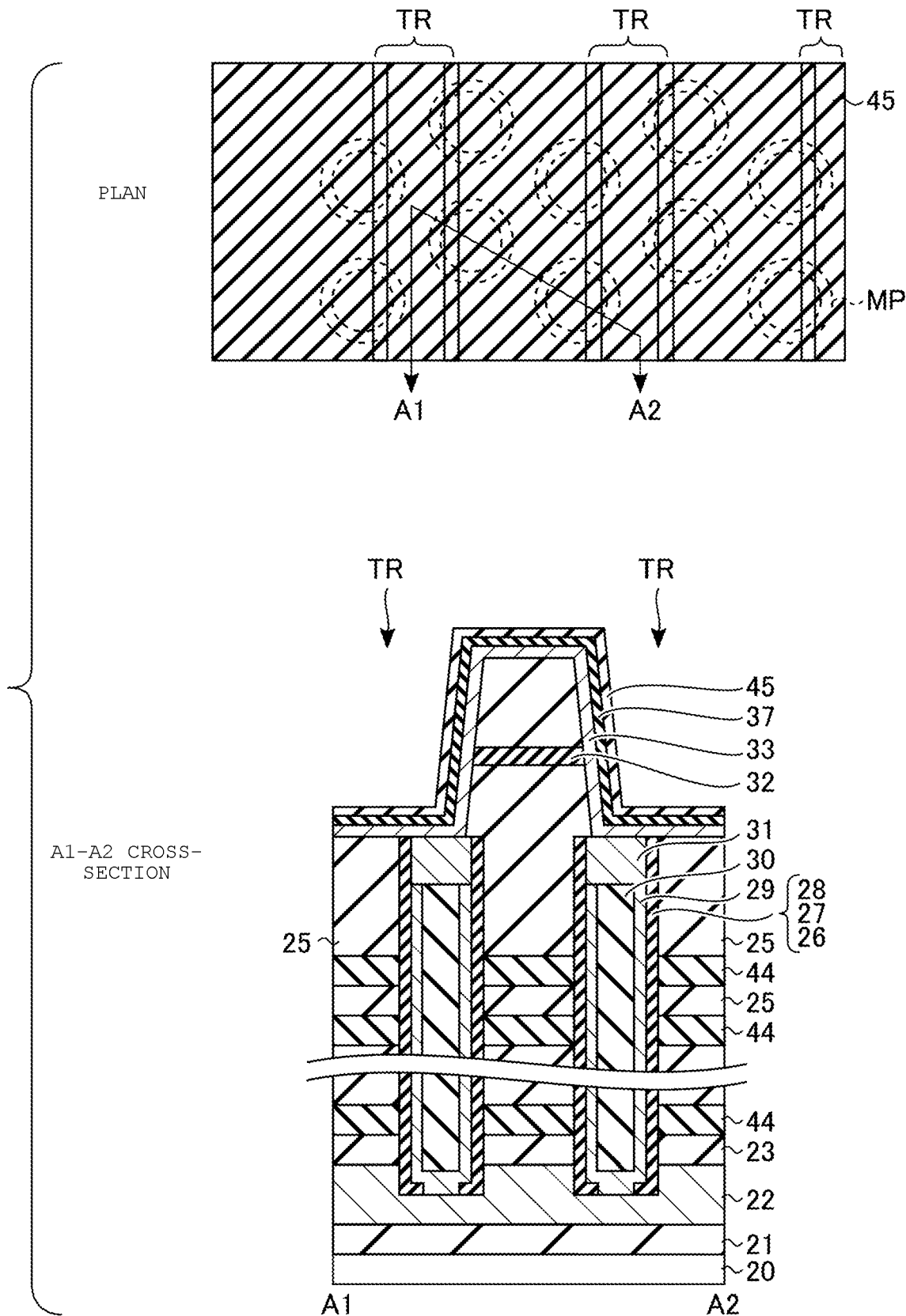
FIG. 8 is a cross-sectional view of the memory array showing an example of a manufacturing process of the semiconductor storage device according to the embodiment.

As shown in FIG. 8, a trench TR (groove pattern) is formed such that the trench extends in the X direction and the bottom surface thereof reaches the memory pillar MP. At this time, for example, the processing damage on the upper surface of the memory pillar MP may be reduced by using the insulating layer 32 as an etching stopper and processing the trench TR in two stages. At a bottom portion of the trench TR, a part of the upper surface of each memory pillar MP arranged in a staggered arrangement in two rows is exposed.

Next, the semiconductor layer 33, the stacked body 37 (that is, the insulating layers 34 to 36), and the insulating layer 45 are sequentially stacked. At this time, the semiconductor layer 33 is connected to the upper surface of the memory pillar MP, that is, the cap layer 31. The insulating layer 45 functions as, for example, a protective layer of the stacked body 37. A material capable of obtaining a wet etching selection ratio with respect to the stacked body 37 is used for the insulating layer 45, for example.

Figure 9:
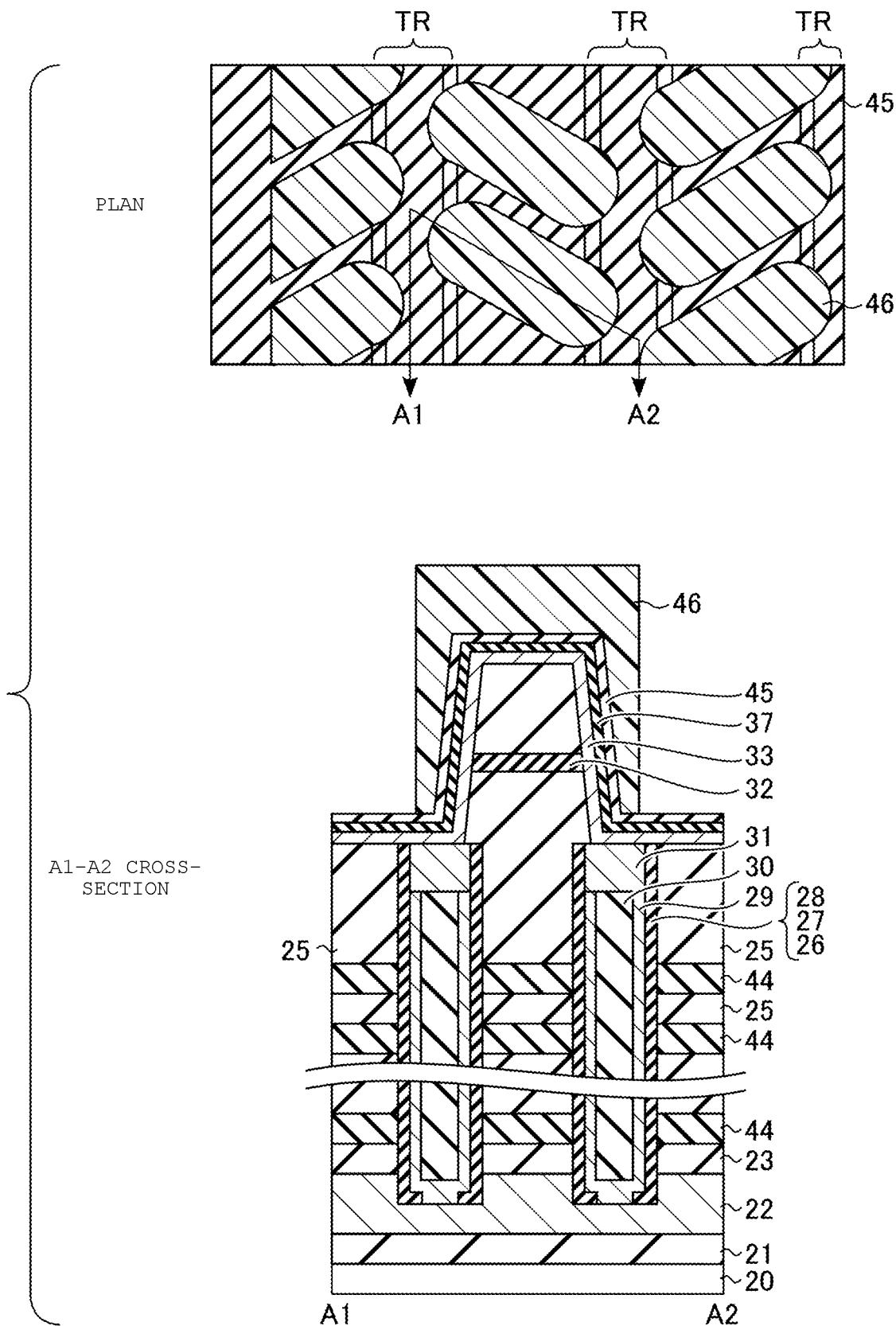
FIG. 9 is a cross-sectional view of the memory array showing an example of a manufacturing process of the semiconductor storage device according to the embodiment.

As shown in FIG. 9, a mask pattern (resist 46) that covers above the two memory pillars MP adjacent to each other is formed between the two trenches TR by using photolithography.

Figure 10:
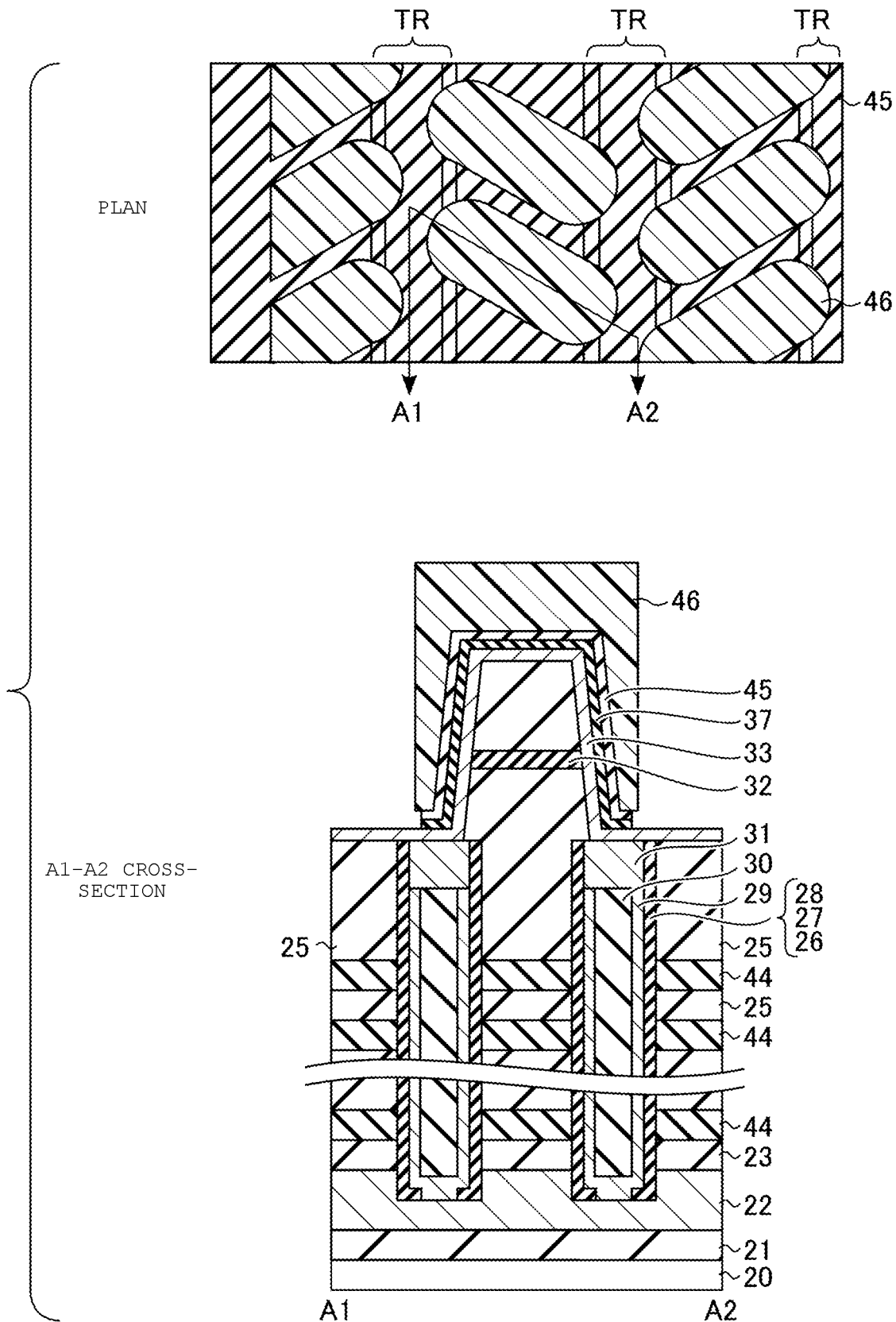
FIG. 10 is a cross-sectional view of the memory array showing an example of a manufacturing process of the semiconductor storage device according to the embodiment.

As shown in FIG. 10, for example, the insulating layer 34 and the insulating layer 45 in the region not covered with the resist 46 are removed by using chemical dry etching (CDE).

Figure 11:
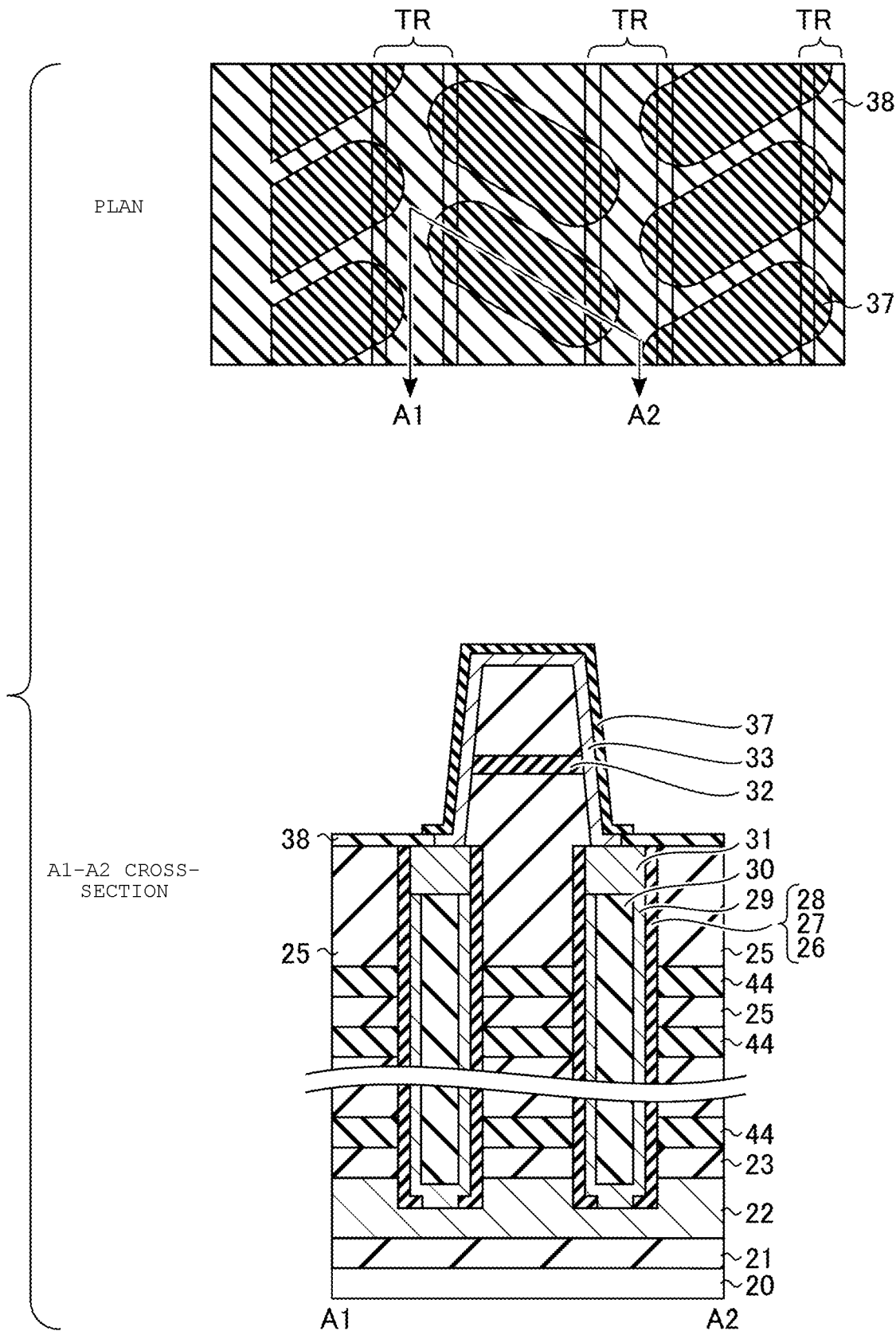
FIG. 11 is a cross-sectional view of the memory array showing an example of a manufacturing process of the semiconductor storage device according to the embodiment.

As shown in FIG. 11, after the resist 46 is removed, the surface is exposed, that is, a part of a region of the semiconductor layer 33 in which the stacked body 37 and the insulating layer 45 are not provided on the upper surface thereof is oxidized thereby forming the insulating layer 38. In various embodiments, the semiconductor layer 33 in the region in which the surface thereof is covered with the stacked body 37 and the insulating layer 45 is not oxidized. The end region of the semiconductor layer 33 in which the surface thereof is covered with the stacked body 37 and the insulating layer 45 may be oxidized.

Next, for example, the insulating layer 45 is removed by using wet etching.

Figure 12:
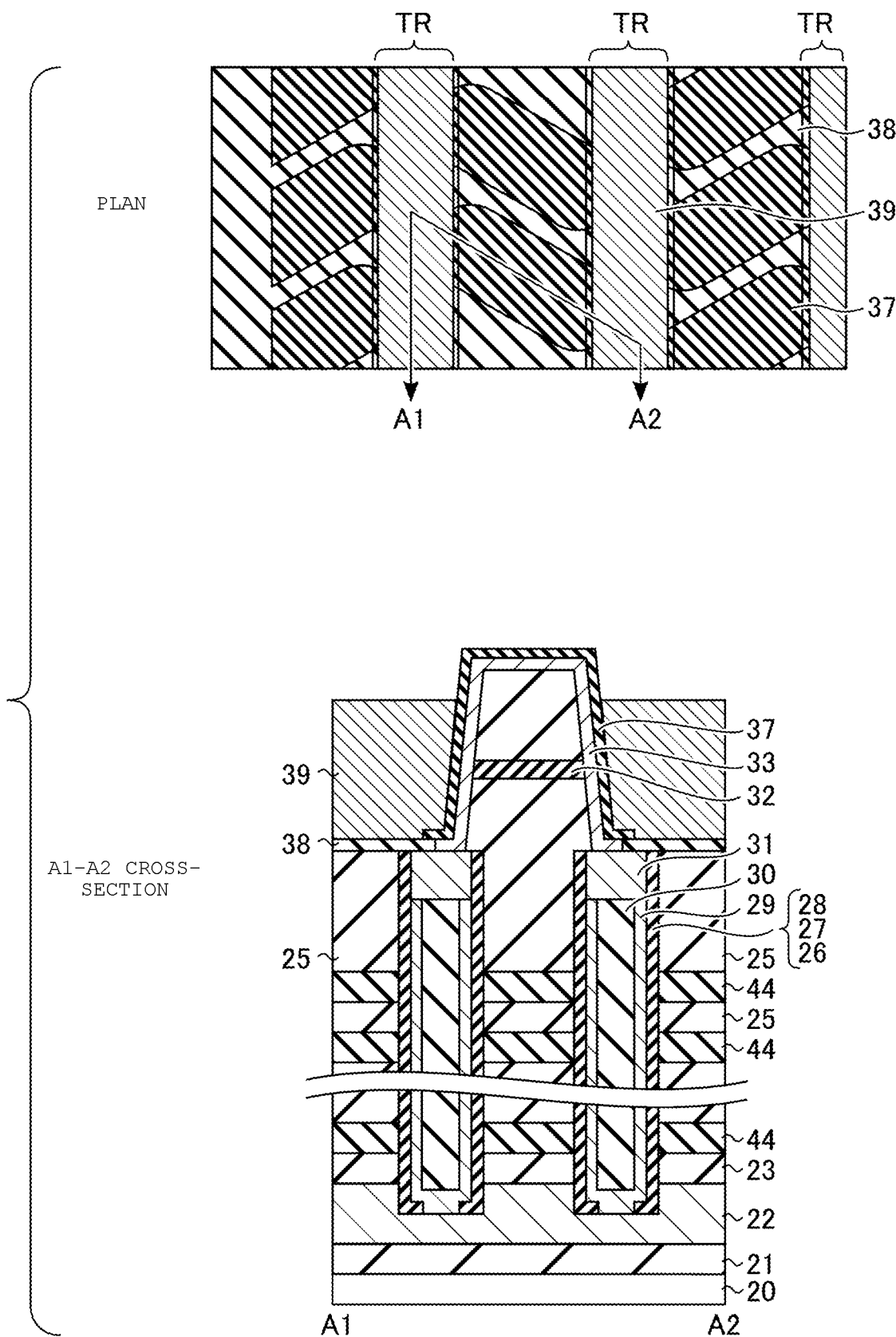
FIG. 12 is a cross-sectional view of the memory array showing an example of a manufacturing process of the semiconductor storage device according to the embodiment.

As shown in FIG. 12, the wiring layer 39 is formed in the trench TR. More specifically, for example, TiN and W are formed in order, and the trench TR is embedded. Next, TiN and W on the surface and the upper portion of the trench TR are removed and the wiring layer 39 is formed. At this time, the wiring layer 39 is formed such that the upper surface of the wiring layer 39 is lower than the upper surface of the semiconductor layer 33 (semiconductor layer 33c). That is, the wiring layer 39 is formed such that the trench TR is not completely embedded. Therefore, the wiring layer 39 has a recessed shape. In other words, the stacked body 37 protrudes from the surface of the wiring layer 39.

Figure 13:
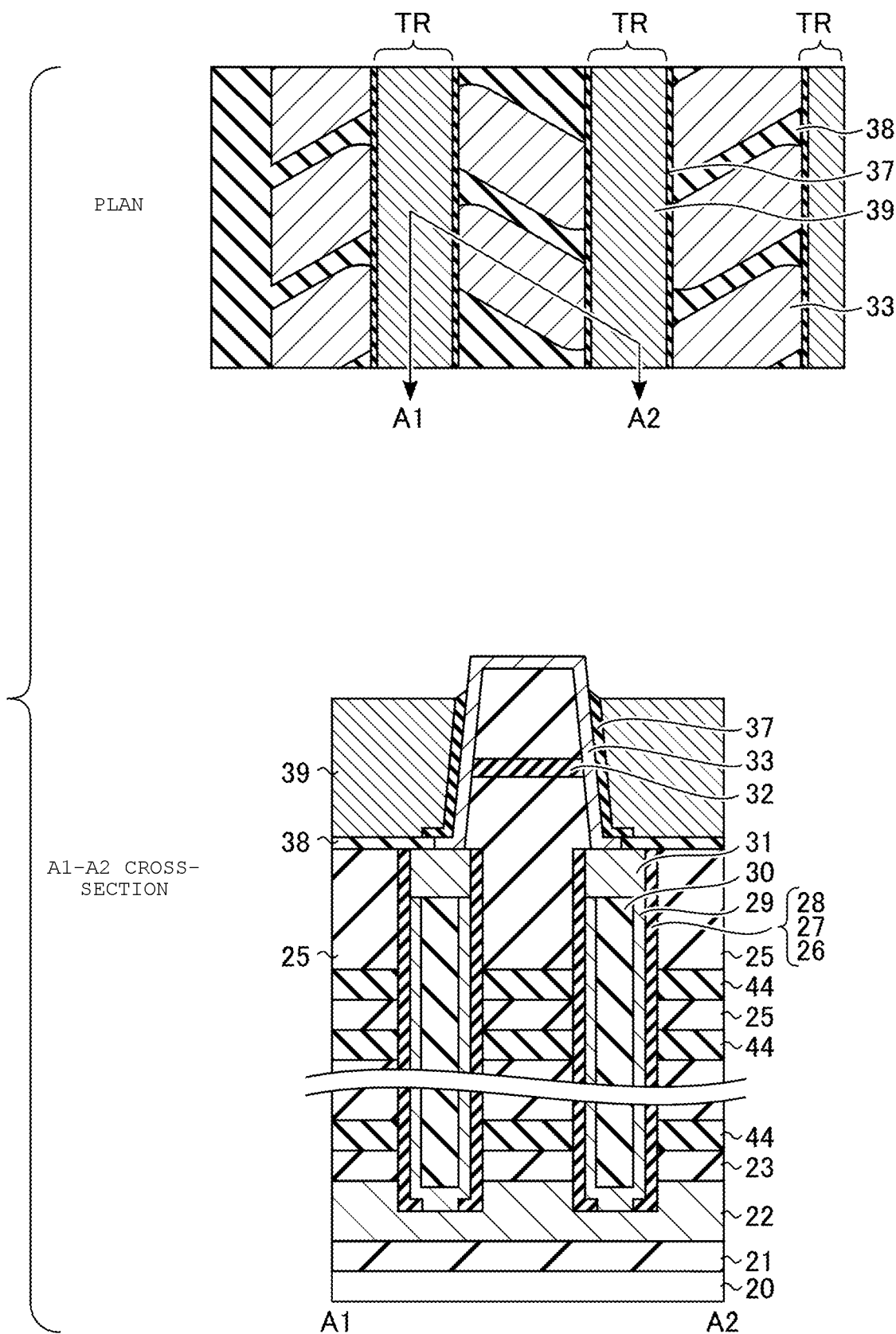
FIG. 13 is a cross-sectional view of the memory array showing an example of a manufacturing process of the semiconductor storage device according to the embodiment.

As shown in FIG. 13, for example, by using the CDE, the exposed part of the stacked body 37, that is, the stacked body that is in contact with the upper portion of the semiconductor layer 33b which is in a higher location than the upper surface of the semiconductor layer 33c and the upper surface of the wiring layer 39 is removed. As a result, the upper portion of the side surface of the semiconductor layer (semiconductor layer 33b) and the upper surface of the semiconductor layer 33 (semiconductor layer 33c) are exposed.

Figure 14:
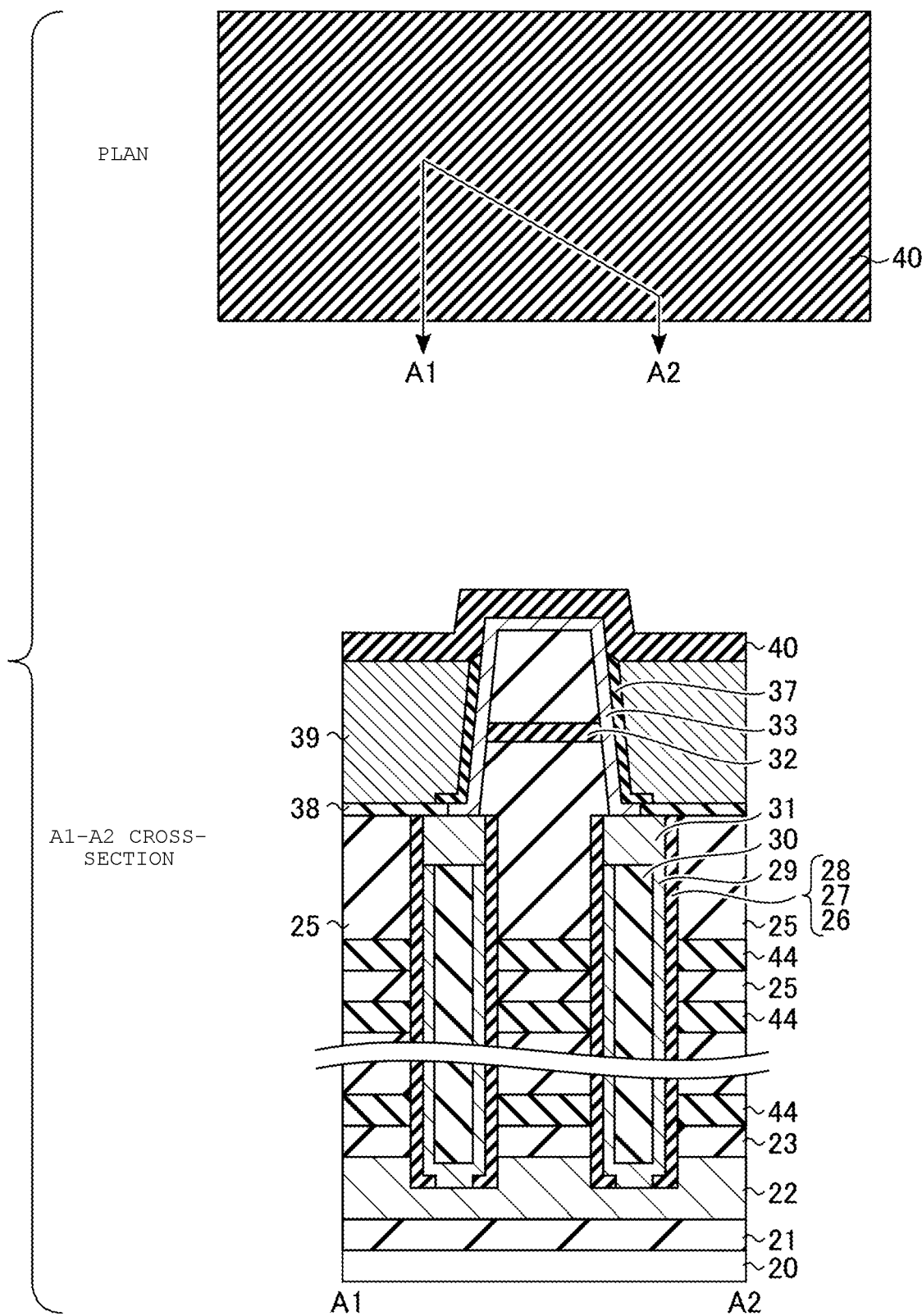
FIG. 14 is a cross-sectional view of the memory array showing an example of a manufacturing process of the semiconductor storage device according to the embodiment.

As shown in FIG. 14, the insulating layer 40 is deposited by using, for example, the CVD.

Figure 15:
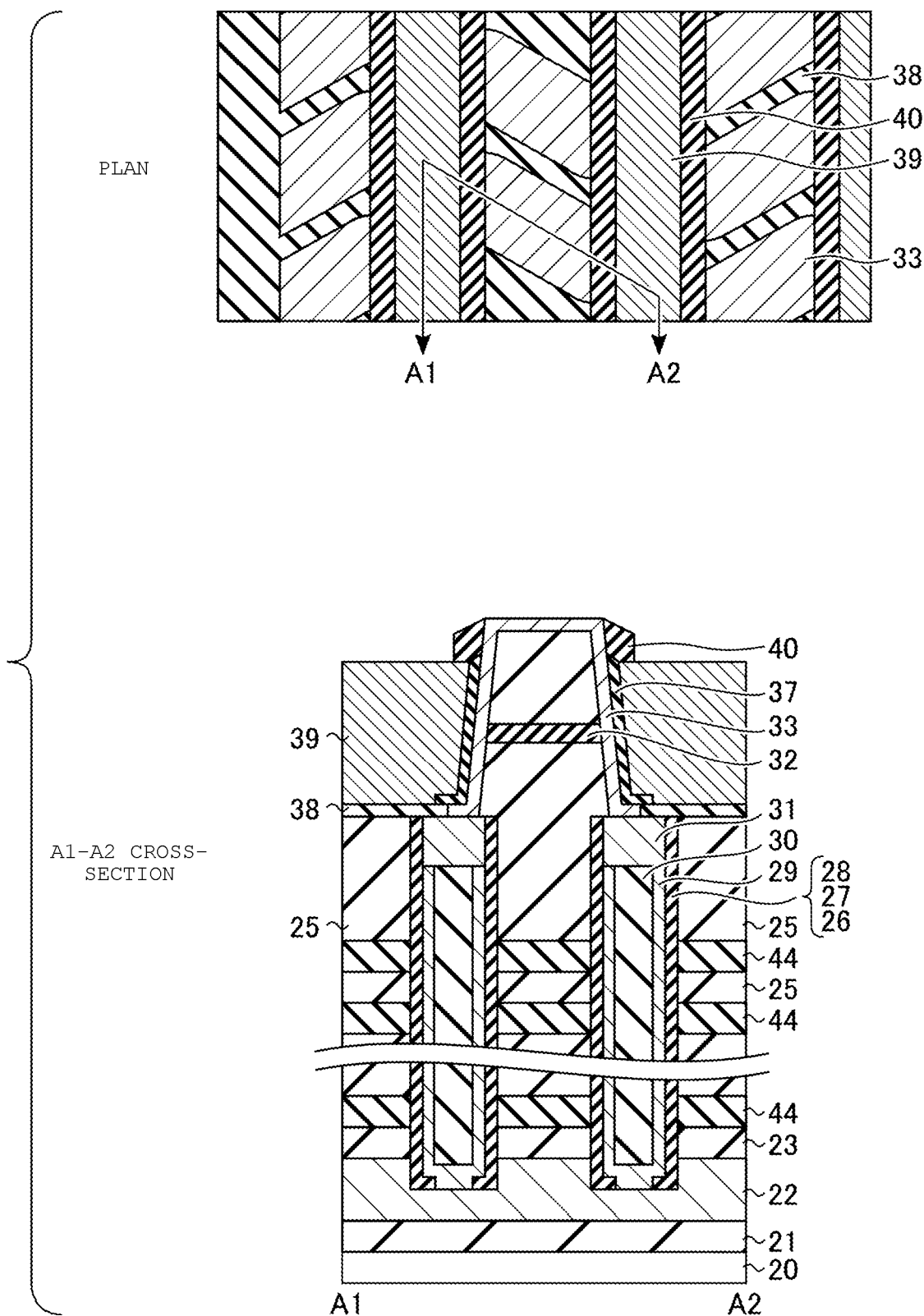
FIG. 15 is a cross-sectional view of the memory array showing an example of a manufacturing process of the semiconductor storage device according to the embodiment.

As shown in FIG. 15, for example, etching of the insulating layer 40 by using reactive ion etching (RIE) (hereinafter, also referred to as "etching back") is performed. In the etching back of the insulating layer 40, the insulating layer other than the region in contact with the side surface of the semiconductor layer 33 is removed. That is, a side surface part of the insulating layer 40 (the part in contact with the side surface of the semiconductor layer 33) remains. In other words, the insulating layer 40 is formed such that the insulating layer 40 is provided on the upper surfaces of the end portions of the stacked body 37 and the wiring layer 39, and the side surface thereof is in contact with the upper portion of the side surface of the semiconductor layer 33 (semiconductor layer 33b).

Figure 16:
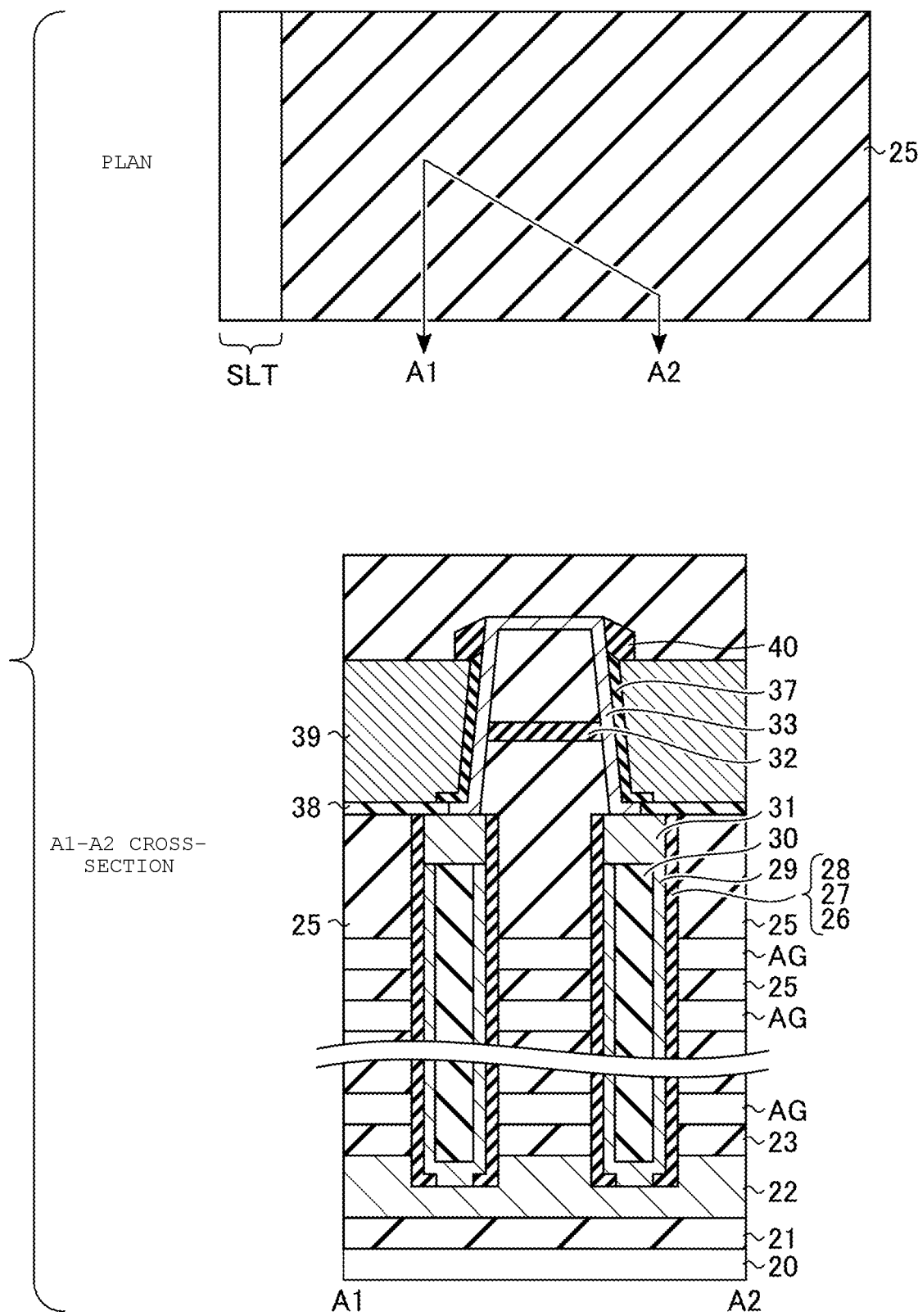
FIG. 16 is a cross-sectional view of the memory array showing an example of a manufacturing process of the semiconductor storage device according to the embodiment.

As shown in FIG. 16, the insulating layer 25 is formed. Thereafter, for example, the surface of the insulating layer 25 is flattened by using the chemical mechanical polishing (CMP) or the like. Next, a replacement is performed. More specifically, first, a slit SLT in which the bottom surface thereof reaches the insulating layer 23 is processed. At this time, for example, the insulating layer 32 is prevented from being exposed on the side surface of the slit SLT. Next, the sacrifice layer 44 is removed from the side surface of the slit SLT by using the wet etching to form a gap AG.

Figure 17:
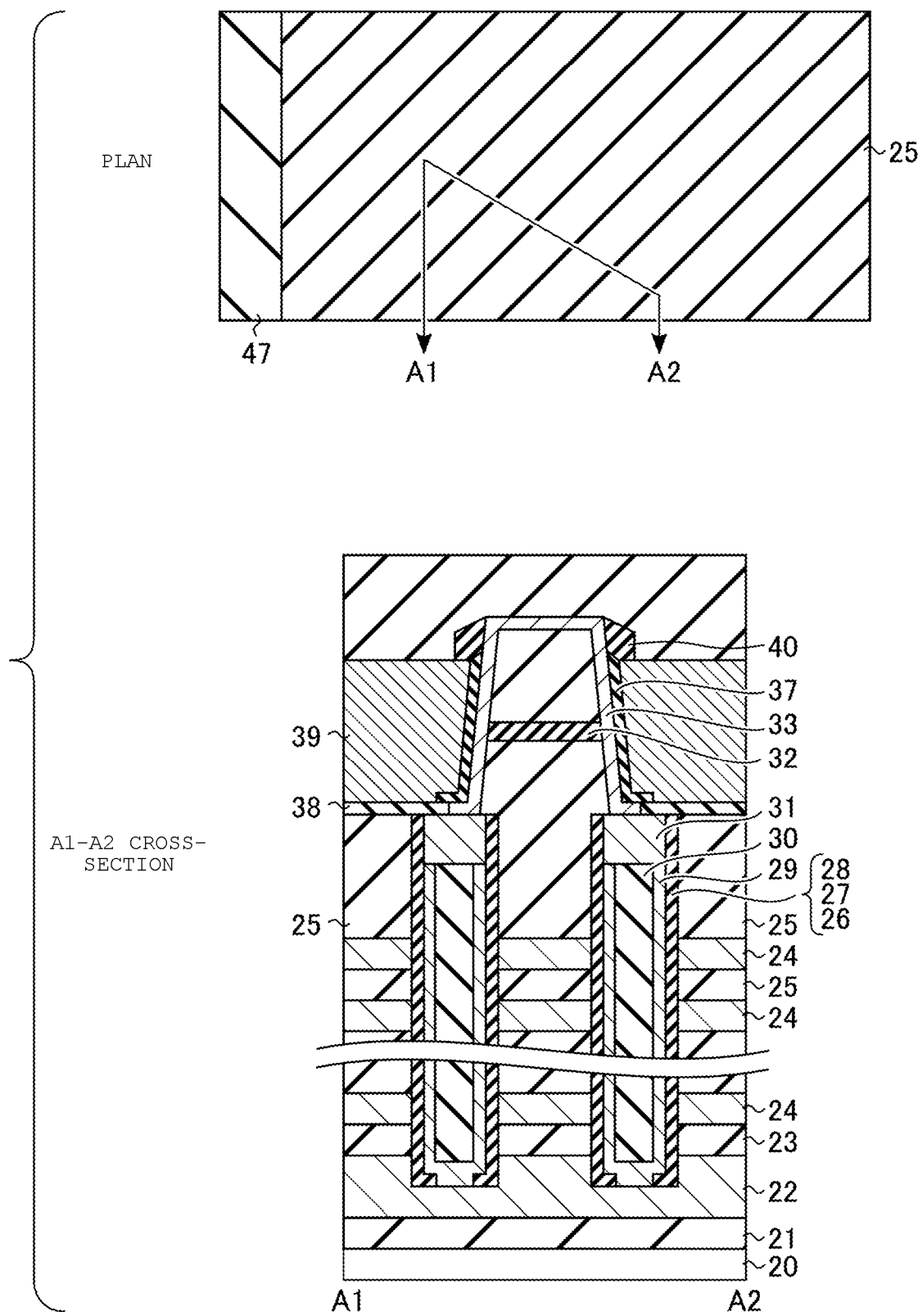
FIG. 17 is a cross-sectional view of the memory array showing an example of a manufacturing process of the semiconductor storage device according to the embodiment.

As shown in FIG. 17, next, the inside of the gap AG is embedded by forming TiN and W in order, and then the TiN and W formed in the slit SLT and formed on the uppermost insulating layer 25 are removed to form the wiring layer 24. Next, the slit SLT is embedded by the insulating layer 47. In this way, the replacement is ended.

Figure 18:
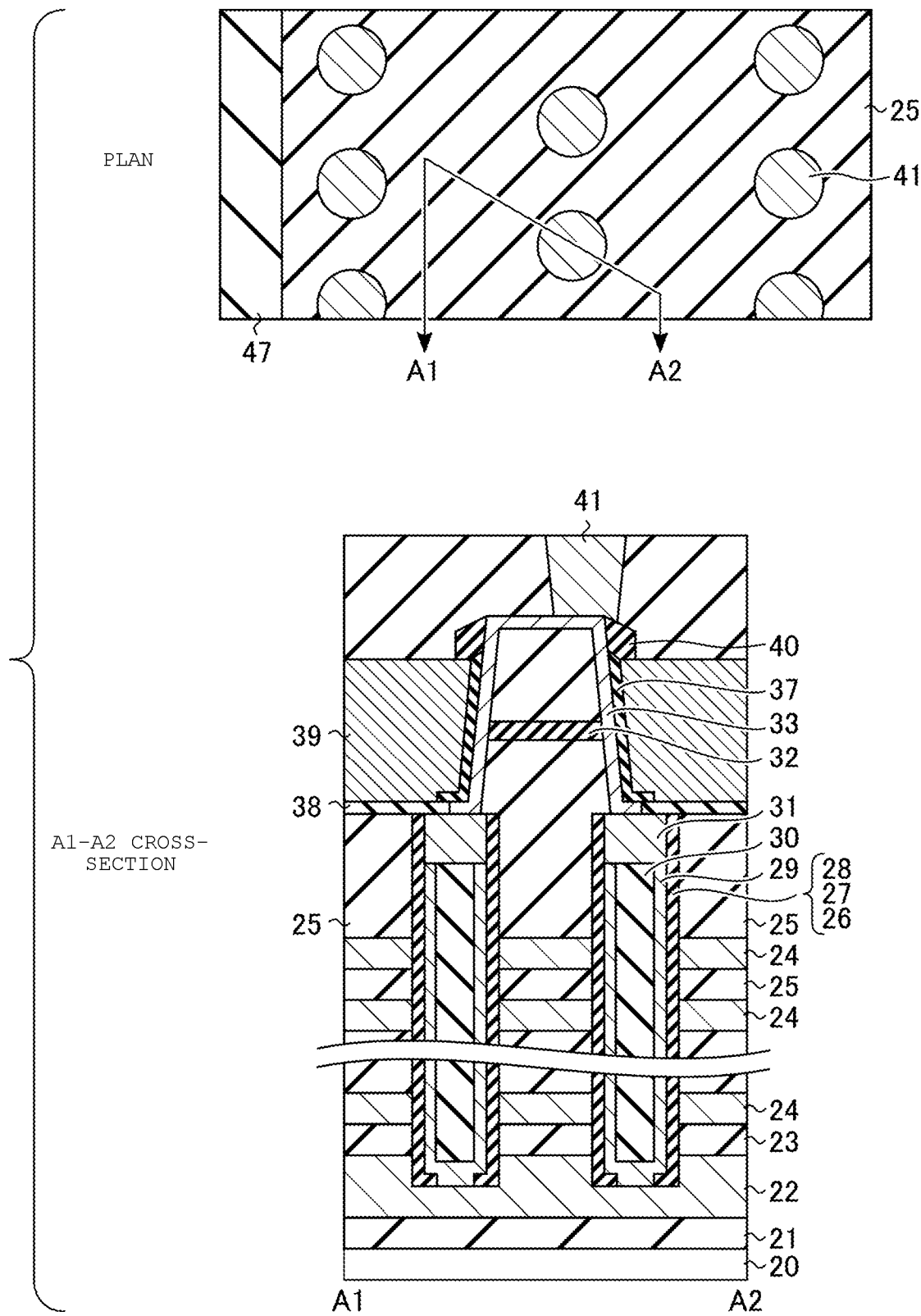
FIG. 18 is a cross-sectional view of the memory array showing an example of a manufacturing process of the semiconductor storage device according to the embodiment.

As shown in FIG. 18, a conductor 41 in which the bottom surface thereof is in contact with the semiconductor layer 33 is formed.

Figure 19:
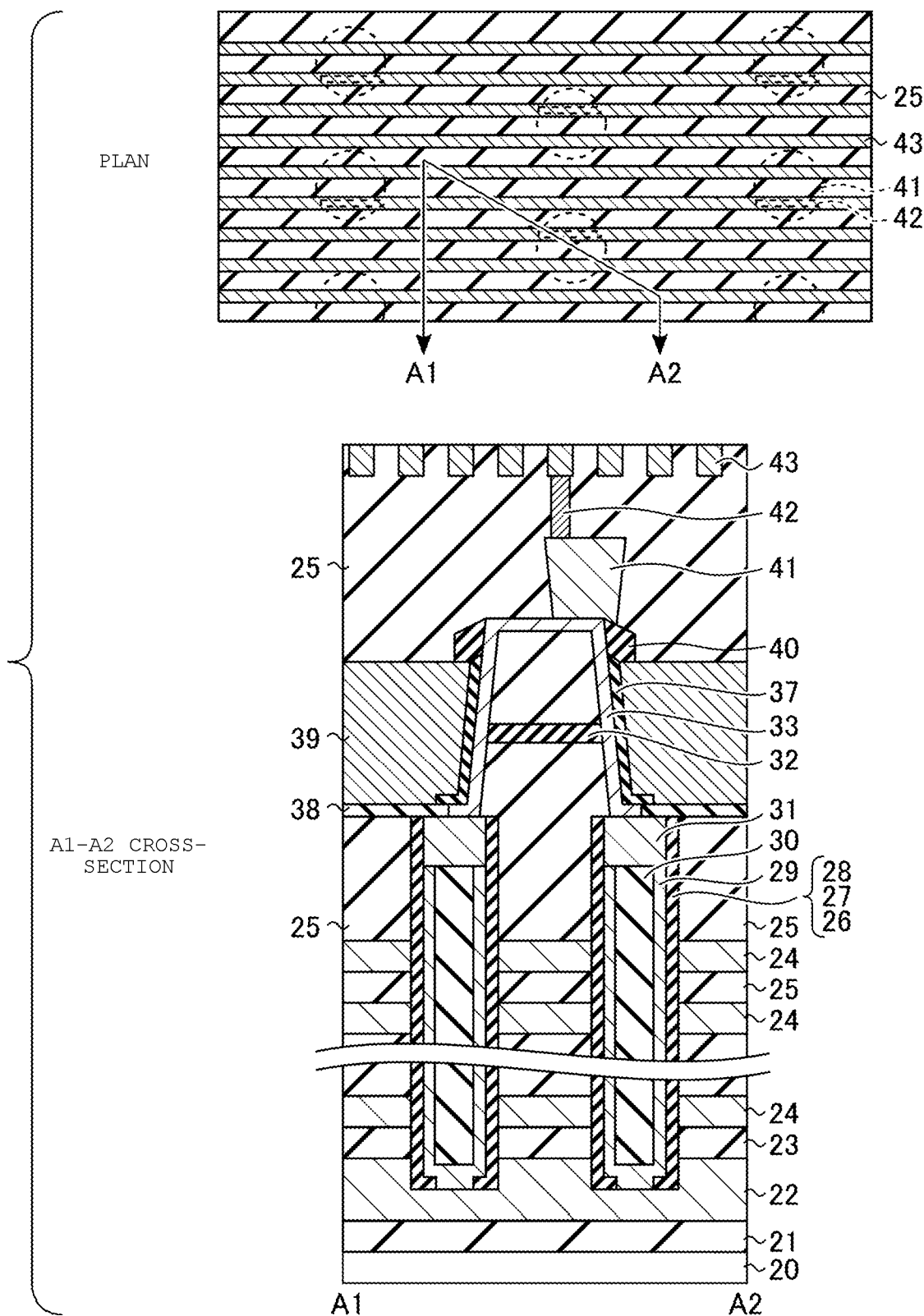
FIG. 19 is a cross-sectional view of the memory array showing an example of a manufacturing process of the semiconductor storage device according to the embodiment.

As shown in FIG. 19, after the insulating layer 25 is formed, the conductor 42 and the wiring layer 43 are formed.

4 Effects of Present Embodiment

With the configuration according to the present embodiment, it is possible to provide a semiconductor storage device that can improve reliability. The effects will be described in detail.

With the configuration according to the present embodiment, the select gate line SGD can be formed so as to pass above a part of the region of the memory pillar MP. The select transistor ST1 along the side surface and the bottom surface of the select gate line SGD can be formed on the memory pillar MP. Further, the stopper layer STP can be formed on a gate insulating film (stacked body 37) of the select transistor ST1. As a result, even when the disposition of the contact plug CP1 is shifted to the select gate line SGD side due to the manufacturing variation, it is possible to prevent the gate insulating film from being processed by the stopper layer STP.

Further, according to the configuration of the present embodiment, since the stopper layer STP is provided between the contact plug CP1 and the select gate line SGD, a short circuit between the wirings or dielectric breakdown between the contact plug CP1 and the select gate line SGD can be prevented. Therefore, the reliability of the semiconductor storage device can be improved.

Further, according to the configuration of the present embodiment, since a short circuit between wirings or dielectric breakdown between the contact plug CP1 and the select gate line SGD due to the manufacturing variation can be prevented, the manufacturing yield can be improved.

5. Modification Example or the Like

According to the above embodiment, a semiconductor storage device includes: a plurality of first wiring layers (WL) that are stacked in a first direction (Z direction); a first memory pillar (MP2) that includes a first semiconductor layer (29) extending in the first direction inside the plurality of first wiring layers; a second wiring layer (39, SGD0) that is disposed above the first semiconductor layer; a second semiconductor layer (33) that includes a first part (33a) disposed between the first semiconductor layer and the second wiring layer, a second part (33b) extending above the first semiconductor layer, and a third part (33c) provided on the second part; a first insulating layer (37) that is disposed between the first part and the second wiring layer and disposed between the second part and the second wiring layer; and a second insulating layer (40) that is provided on the first insulating layer and in contact with apart of the second part.

By applying the above embodiment, it is possible to provide a semiconductor storage device that can improve reliability.

The embodiment is not limited to the above-described form, and various modifications can be made.

For example, in the above embodiment, two memory pillars MP adjacent to each other are commonly connected to one contact plug CP1, but the disposition of the memory pillar MP and the contact plug CP1 is not limited to this. For example, a contact plug CP1 may be provided for each memory pillar MP. In this case, the semiconductor layer 33 is also provided for each memory pillar MP.

Further, the center of the memory pillar MP in the Y direction and the center of the select gate line SGD may be identical with each other. In this case, two select transistors ST1 can be formed on one memory pillar MP.

Further, the "connection" in the above embodiment also includes a state in which objects are indirectly connected with something else, such as a transistor or a resistor, in between.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
    a plurality of first wiring layers stacked in a first direction;
    a first memory pillar including a first semiconductor layer extending in the first direction and penetrating the plurality of first wiring layers;
    a second wiring layer disposed above the first semiconductor layer;
    a second semiconductor layer including a first part disposed between the first semiconductor layer and the second wiring layer, a second part extending away from the first semiconductor layer, and a third part provided on the second part;
    a first insulating layer disposed between the first part and the second wiring layer and between the second part and the second wiring layer; and
    a second insulating layer provided on the first insulating layer and in contact with at least a portion of the second part.

2. The semiconductor storage device according to claim 1, further comprising:
    a second memory pillar including a third semiconductor layer extending in the first direction and penetrating the plurality of first wiring layers; and
    a third wiring layer disposed above the third semiconductor layer,
    wherein the second semiconductor layer further includes
        a fourth part disposed between the third semiconductor layer and the third wiring layer, and
        a fifth part extending above the third semiconductor layer and connected to the third part.

3. The semiconductor storage device according to claim 2, further comprising:
    a third insulating layer disposed between the fourth part and the third wiring layer and between the fifth part and the third wiring layer; and
    a fourth insulating layer provided on the third insulating layer and in contact with at least a portion of the fifth part.

4. The semiconductor storage device according to claim 1, wherein a portion of a bottom surface of the second insulating layer is in contact with at least a portion of an upper surface of the second wiring layer.

5. The semiconductor storage device according to claim 2, further comprising
    a conductor provided on the fifth part of the second semiconductor layer.

6. The semiconductor storage device according to claim 5, wherein a portion of a bottom surface of the conductor is in contact with at least a portion of an upper surface of the second insulating layer.

7. The semiconductor storage device according to claim 1, wherein the first memory pillar further includes a charge storage layer.

8. The semiconductor storage device according to claim 1, wherein the first and third parts are parallel with each other, with the second part connected between the first and third parts.

9. The semiconductor storage device according to claim 1, wherein the first insulating layer extends along the second part.

10. The semiconductor storage device according to claim 1, wherein the second semiconductor layer includes an oxidized portion provided between the first semiconductor layer and the second wiring layer.

11. The semiconductor storage device according to claim 2, wherein the first and second memory pillars are staggered to each other in the first direction.

* * * * *